(12) United States Patent
Lee et al.

(10) Patent No.: US 11,749,615 B2
(45) Date of Patent: Sep. 5, 2023

(54) DISPLAY DEVICE INCLUDING ALIGNMENT PATTERN

(71) Applicant: Samsung Display Co., Ltd., Yongin-Si (KR)

(72) Inventors: Seungchan Lee, Yongin-si (KR); Sungjin Hong, Yongin-si (KR); Sanghee Jang, Yongin-si (KR); Sunhee Lee, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 97 days.

(21) Appl. No.: 17/345,051

(22) Filed: Jun. 11, 2021

(65) Prior Publication Data

US 2022/0068830 A1      Mar. 3, 2022

(30) Foreign Application Priority Data

Aug. 26, 2020   (KR) .................. 10-2020-0107966

(51) Int. Cl.
*H01L 29/12*      (2006.01)
*H01L 23/544*      (2006.01)
*H10K 59/122*      (2023.01)
*H10K 59/124*      (2023.01)
*H10K 59/121*      (2023.01)

(52) U.S. Cl.
CPC ......... *H01L 23/544* (2013.01); *H10K 59/122* (2023.02); *H10K 59/124* (2023.02); *H10K 59/1216* (2023.02); *H01L 2223/54426* (2013.01)

(58) Field of Classification Search
CPC .............. H01L 23/544; H01L 27/3246; H01L 27/3258; H01L 27/3265; H01L 2223/54426
USPC ......................................... 257/71
See application file for complete search history.

(56) References Cited

U.S. PATENT DOCUMENTS 7,911,561 B2     3/2011  Seok et al.
10,042,028 B2    8/2018  Jo et al.
(Continued)

FOREIGN PATENT DOCUMENTS

CN     110444125 A    11/2019
CN     110571254 A    12/2019
(Continued)

*Primary Examiner* — Phuc T Dang
(74) *Attorney, Agent, or Firm* — Innovation Counsel LLP

(57) ABSTRACT

A display device includes: a substrate including a first component area in which a first transmission portion is arranged, a second component area that surrounds the first component area and in which a second transmission portion is arranged, and a main display area surrounding at least a portion of the second component area; an insulating layer having a first transmission hole corresponding to the first transmission portion and a second transmission hole corresponding to the second transmission portion, the first transmission hole and the second transmission hole exposing an upper surface of the substrate; a plurality of display elements arranged on the insulating layer and corresponding to the first component area, the second component area, and the main display area; and an alignment pattern arranged on the substrate and overlapping the second transmission hole and configured to align a component with the second component area.

20 Claims, 24 Drawing Sheets

(56) References Cited

U.S. PATENT DOCUMENTS

| 2014/0147976 | A1* | 5/2014 | Shim | G03F 1/22 |
| | | | | 430/5 |
| 2016/0149165 | A1* | 5/2016 | Kim | H01L 51/5284 |
| | | | | 257/40 |
| 2018/0366586 | A1 | 12/2018 | Son et al. | |

FOREIGN PATENT DOCUMENTS

| CN | 111244107 A | * | 6/2020 | G09F 9/33 |
| KR | 10-1331942 B1 | | 11/2013 | |
| KR | 10-1652046 B1 | | 8/2016 | |

* cited by examiner

DISPLAY DEVICE INCLUDING ALIGNMENT PATTERN

CROSS-REFERENCE TO RELATED APPLICATION

This application is based on and claims priority under 35 U.S.C. § 119 to Korean Patent Application No. 10-2020-0107966, filed on Aug. 26, 2020, in the Korean Intellectual Property Office, the disclosure of which is incorporated by reference herein in its entirety.

BACKGROUND

1. Field

One or more embodiments relate to a display device including an alignment pattern.

2. Description of Related Art

Recently, the usage of display devices has been diversified. As display devices become thinner and lighter, their usage is greatly expanded.

Various features and/or functions may be added to the display device by increasing a display area. Studies have been conducted to develop a display device having a component area that is capable of performing various functions and displaying an image.

In the component area, a transmission portion may be arranged with a display element. In this case, light or sound may transmit through the transmission portion to reach a component, or light or sound generated from the component may be transmitted through the transmission portion and output to the outside.

SUMMARY

One or more embodiments of the present disclosure provide a display device in which a component area and a component are accurately aligned with each other.

Additional aspects of the present disclosure will be set forth in part in the description which follows and, in part, will be apparent from the description, or may be learned by practice of the embodiments of the present disclosure.

According to one or more embodiments, a display device includes a substrate including: a first component area in which a first transmission portion is arranged, a second component area that surrounds the first component area and in which a second transmission portion is arranged, and a main display area surrounding at least a portion of the second component area: an insulating layer having a first transmission hole corresponding to the first transmission portion and a second transmission hole corresponding to the second transmission portion, the first transmission hole and the second transmission hole exposing an upper surface of the substrate; a plurality of display elements arranged on the insulating layer and corresponding to the first component area, the second component area, and the main display area; and an alignment pattern arranged on the substrate and overlapping the second transmission hole and configured to align a component with the second component area.

According to an embodiment, the insulating layer may include an inorganic insulating layer arranged on the substrate and an organic insulating layer arranged on the inorganic insulating layer, and the inorganic insulating layer may have a first hole that exposes the alignment pattern in the second transmission portion.

According to an embodiment, the organic insulating layer may have a second hole connected to the first hole, and the second hole exposes the alignment pattern.

According to an embodiment, each of the plurality of display elements may include a pixel electrode and an opposite electrode, the opposite electrode may have an opposite electrode hole connected to the second transmission hole, and the opposite electrode hole may expose the alignment pattern.

According to an embodiment, the display device may further include a thin-film transistor connected to each of the plurality of display elements, the thin-film transistor including a semiconductor layer that includes a channel region, and a source region and a drain region that are arranged on sides of the channel region, wherein the alignment pattern may include a same material as that of at least one of the source region and the drain region.

According to an embodiment, the display device may further include: a thin-film transistor connected to each of the plurality of display elements, the thin-film transistor including a semiconductor layer that includes a channel region and a gate electrode overlapping the channel region; and a storage capacitor including a lower electrode that is integrally provided with the gate electrode and an upper electrode that is arranged on the lower electrode, wherein the alignment pattern may include a same material as that of one of the lower electrode and the upper electrode.

According to an embodiment, the display device may further include a thin-film transistor arranged on the substrate, the thin-film transistor including: a semiconductor layer that includes a channel region, and a source region and a drain region that are arranged on sides of the channel region; and a source electrode and a drain electrode respectively connected to the source region and the drain region, wherein the insulating layer may include an inorganic insulating layer that covers the semiconductor layer and an organic insulating layer that is arranged on the inorganic insulating layer, the source electrode and the drain electrode may be arranged between the inorganic insulating layer and the organic insulating layer, and the alignment pattern may include a same material as that of one of the source electrode and the drain electrode.

According to an embodiment, each of the plurality of display elements may include a pixel electrode and an opposite electrode, and the alignment pattern may include a same material as that of the pixel electrode.

According to an embodiment, the component may include: a lens overlapping the first component area; and a module in which the lens is arranged, the module overlapping the second component area.

According to an embodiment, the module may include an alignment mark that overlaps the alignment pattern.

According to an embodiment, the component may further include a sensor that is connected to the module and configured to detect a position of the alignment pattern.

According to an embodiment, the second transmission portion may include a plurality of second transmission portions in the second component area, wherein the insulating layer may have a plurality of second transmission holes in the plurality of second transmission portions, respectively, and the alignment pattern may overlap at least one of the plurality of second transmission holes.

According to one or more embodiments, a display device includes: a substrate including a first component area in which a first transmission portion is arranged, a second component area that surrounds the first component area and in which a second transmission portion is arranged, the second transmission portion having a second light transmittance that is different from a first light transmittance of the first transmission portion, and a main display area surrounding at least a portion of the second component area; an insulating layer arranged on the substrate and having a first transmission hole corresponding to the first transmission portion and exposing a first portion of an upper surface of the substrate; and a plurality of display elements arranged on the insulating layer and corresponding to the first component area, the second component area, and the main display area, wherein the insulating layer includes an inorganic insulating layer and an organic insulating layer that is arranged on the inorganic insulating layer, and at least one of the inorganic insulating layer and the organic insulating layer has a second transmission hole that exposes a second portion of the upper surface of the substrate in the second transmission portion.

According to an embodiment, the inorganic insulating layer may be continuously arranged in the second transmission portion, and the organic insulating layer may have a second transmission hole in the second transmission portion.

According to an embodiment, the inorganic insulating layer may have a second transmission hole in the second transmission portion, and the organic insulating layer may be continuously arranged in the second transmission portion.

According to an embodiment, each of the inorganic insulating layer and the organic insulating layer may have a second transmission hole in the second transmission portion, wherein each of the plurality of display elements may include a pixel electrode and an opposite electrode, the display device may further include a pixel defining layer that covers an edge of the pixel electrode, and the pixel defining layer may have a third hole connected to the first transmission hole and may be continuously arranged in the second transmission portion.

According to an embodiment, each of the plurality of display elements may include a pixel electrode and an opposite electrode, and the opposite electrode may have an opposite electrode hole connected to the first transmission hole and may be continuously arranged in the second transmission portion.

According to an embodiment, the display device may further include a component, wherein the component may include a lens overlapping the first component area, and a module in which the lens is arranged, and the module overlapping the second component area.

According to an embodiment, the display device may further include an alignment mark that overlaps the second transmission portion.

According to an embodiment, the component may further include a sensor connected to the module and configured to detect a position of the second transmissive portion using a difference between the first light transmittance of the first transmission portion and the second light transmittance of the second transmission portion.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1A:
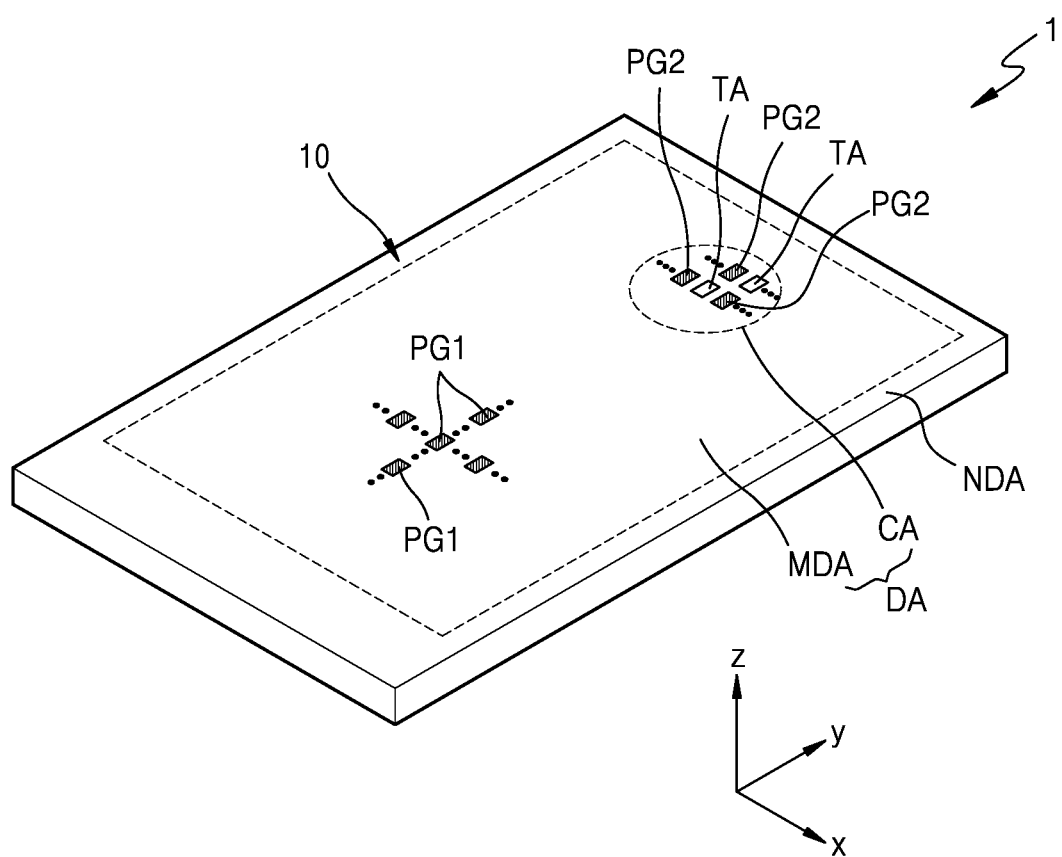
FIG. 1A is a schematic perspective view of a display device according to an embodiment.

Reference will now be made in detail to various embodiments of the present disclosure, examples of which are illustrated in the accompanying drawings, wherein like reference numerals refer to like elements throughout the present disclosure. In this regard, the embodiments disclosed herein may have different forms and should not be construed as being limited to the descriptions set forth herein. Accordingly, the embodiments are merely described below, by referring to the figures, to explain aspects of the present disclosure. As used herein, the term "and/or" includes any and all combinations of one or more of the associated listed items. Throughout the present disclosure, the expression "at least one of a, b or c" indicates only a, only b, only c, both a and b, both a and c, both b and c, all of a, b, and c, or any variations thereof.

The present disclosure allows for various changes and numerous embodiments, and certain embodiments will be illustrated in the drawings and described in the written description. Effects and features of the present disclosure, and methods for achieving the same will be clarified with reference to the embodiments described below in detail with reference to the drawings. However, the present disclosure is not limited to the following embodiments and may be embodied in various forms and configurations without deviating from the present disclosure.

One or more embodiments of the present disclosure will be described below in more detail with reference to the accompanying drawings. Components that are the same or are in correspondence with each other may be denoted by the same reference numeral regardless of the figures, and redundant explanations may be omitted.

It will be understood that although the terms "first," "second," etc. may be used herein to describe various elements, these elements should not be limited by these terms. These terms are only used to distinguish one element from another.

Singular forms such as "a," "an," and "the" as used herein are intended to include plural forms as well unless the context clearly indicates otherwise.

It will be further understood that the terms "comprises" and/or "comprising" used herein specify the presence of stated features or elements, but do not preclude the presence or addition of one or more other features or elements.

It will be further understood that, when a layer, region, or component is referred to as being "on" another layer, region, or component, it can be directly or indirectly on the other layer, region, or component. That is, for example, one or more intervening layers, regions, or components may be present therebetween.

Sizes of elements in the drawings may be exaggerated or reduced for convenience of explanation. Since sizes and thicknesses of elements in the drawings are arbitrarily illustrated for convenience of explanation, the present disclosure is not limited to the embodiments disclosed herein.

When a certain embodiment may be implemented differently, a specific process order may be performed differently from the described order. For example, two consecutively described processes may be performed substantially at the same time or performed in an order opposite to the described order.

In the following embodiments, it will be understood that when a layer, region, or component is referred to as being "connected to" or "coupled to" another layer, region, or component, it may be directly or indirectly connected or coupled to the other layer, region, or component. That is, for example, intervening layers, regions, or components may be present. For example, when layers, areas, or elements or the like are referred to as being "electrically connected," they may be directly electrically connected, or layers, areas, or elements may be indirectly electrically connected and one or more intervening portions may be present therebetween.

Examples of a display device that displays an image may include, but are not limited to, a game console, a multimedia device, or a portable mobile device such as an ultra-small personal computer (PC), a laptop computer, and a tablet PC. A display device may be categorized into a liquid crystal display, an electrophoretic display, an organic light-emitting display, an inorganic light-emitting display, a field emission display, a surface-conduction electron-emitter display, a quantum dot display, a plasma display, a cathode ray display, and the like. Hereinafter, an organic light-emitting display device is described as an example of a display device according to an embodiment, but the various types of display devices described above may be used in other embodiments without deviating from the scope of the present disclosure.

Figure 1B:
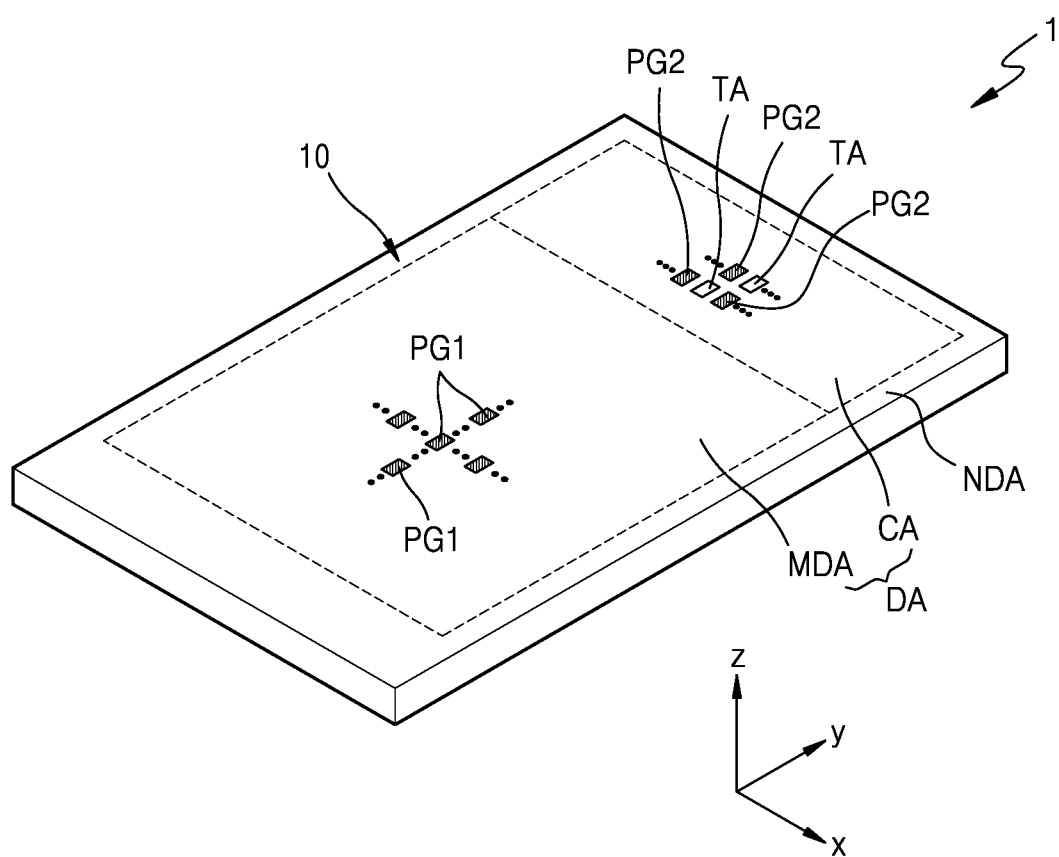
FIG. 1B is a schematic perspective view of a display device according to another embodiment.

FIG. 1A is a schematic perspective view of a display device 1 according to an embodiment. FIG. 1B is a schematic perspective view of the display device 1 according to another embodiment.

Referring to FIG. 1A, the display device 1 may include a display panel 10. The display panel 10 may include a display area DA and a non-display area NDA.

The display area DA may include a main display area MDA and a component area CA. Both the main display area MDA and the component area CA may correspond to areas in which an image is displayed, and the component area CA may correspond to area under which a component (not illustrated) such as a sensor using visible light, infrared light, or sound, a camera, or the like is arranged. According to an embodiment, the component area CA may have higher light transmittance and/or higher sound transmittance than the main display area MDA. According to an embodiment, when light is transmitted through the component area CA, the light transmittance through the component area CA may be, for example, about 25% or greater, or about 30% or greater, about 50% or greater, about 75% or greater, about 80% or greater, about 85% or greater, or about 90% or greater.

A first pixel group PG1 including one or more first pixels may be arranged in the main display area MDA. The first pixel group PG1 may include a plurality of display elements, for example, a plurality of organic light-emitting diodes. The display panel 10 may provide a first image using light emitted from the first pixel group PG1.

According to an embodiment, at least a portion of the component area CA may be surrounded by the main display area MDA. As an example, FIG. 1A illustrates that the component area CA is completely surrounded by the main display area MDA.

According to an embodiment, the component area CA may have a circular shape or an elliptical shape in a plan view (e.g., an xy plane defined by x-direction and y-direction) of the display device 1. According to another embodiment, the component area CA may have a polygonal shape such as a rectangular shape in a plan view. According to another embodiment, the component area CA may include a curved portion. Also, the positions and number of the component areas CA may be variously changed without deviating from the scope of the present disclosure. For example, the display panel 10 may include a plurality of component areas CA.

A second pixel group PG2 including one or more second pixels and a transmission portion TA may be arranged in the component area CA. The second pixel group PG2 may emit light to provide a second image. The second pixel group PG2 may include a plurality of display elements, for example, a plurality of organic light-emitting diodes. In this case, the first image and the second image may correspond to portions of any one image provided by the display device 1 or the display panel 10. Alternatively, the first image and the second image may correspond to images that are independent of each other.

The transmission portion TA may transmit light and/or sound that is output from the corresponding component to the outside or travels toward the component from the outside. In an embodiment, display elements may not be arranged in the transmission portion TA. In this case, a plurality of transmission portions TA may be arranged to be spaced apart from each other in the component area CA.

The non-display area NDA corresponds to an area that does not provide an image, and no pixel groups may be arranged in the non-display area NDA. The non-display area NDA may surround at least a portion of the display area DA. According to an embodiment, the non-display area NDA may completely surround the display area DA. A driver or the like that provides electrical signals or power to the first pixel group PG1 and the second pixel group PG2 may be arranged in the non-display area NDA. The non-display area NDA may include a pad portion to which an electronic element, a printed circuit board, or the like may be electrically connected.

Referring to FIG. 1B, the component area CA may be at least partially surrounded by the main display area MDA. FIG. 1B illustrates that the component area CA is arranged in a bar type at one side of the main display area MDA. However, the component area CA may be arranged in a notch type at one side of the main display area MDA in other embodiments. Hereinafter, a detailed description will be given focusing on a case in which the component area CA is completely surrounded by the main display area MDA in a circular shape in a plan view.

FIGS. 2A, 2B, 2C, and 2D are schematic cross-sectional views of a portion of the display device 1, according to an embodiment.

Referring to FIGS. 2A to 2D, the display device 1 may include the display panel 10 and a component COMP that is arranged to overlap the display panel 10. The display panel 10 may include the main display area MDA and the component area CA that overlaps the component COMP.

The display panel 10 may include a substrate 100, a display layer DISL, a touch-sensing layer TSL, and an optical functional layer OFL that are arranged on the substrate 100, and a panel protection member PB that is arranged under the substrate 100. The display layer DISL may include a buffer layer 111, a pixel circuit layer PCL that includes thin-film transistors such as a main thin-film transistor TFTm and an auxiliary thin-film transistor TFTa, a display element layer EDL that includes an organic light-emitting diode as a display element, and an encapsulation member ENCM such as a thin-film encapsulation layer TFEL shown in FIG. 2A or an encapsulation substrate ENS shown in FIG. 2B.

The main display area MDA and the component area CA may be defined on the substrate 100. That is, the substrate 100 may include the main display area MDA and the component area CA. The substrate 100 may include glass or a polymer resin, such as polyethersulfone, polyacrylate, polyetherimide, polyethylene naphthalate, polyethylene terephthalate, polyphenylene sulfide, polyimide, polycarbonate, cellulose triacetate, or cellulose acetate propionate. The substrate 100 including the polymer resin may be flexible, rollable, or bendable. The substrate 100 may have a multiple layer structure including a base layer (not illustrated) including the above-described polymer resin and a barrier layer (not illustrated).

The buffer layer 111 may be arranged on the substrate 100 and may reduce or prevent infiltration of a foreign material, moisture, or ambient air from below the substrate 100 and may provide a flat surface on the substrate 100. The buffer layer 111 may include an inorganic material such as oxide or nitride, an organic material, or an organic/inorganic composite material and may have a single layer structure or a multiple layer structure including at least one inorganic material and at least one organic material. According to some embodiments, the buffer layer 111 may include silicon oxide ($SiO_2$) or silicon nitride ($SiN_x$).

A main subpixel Pm may include the main thin-film transistor TFTm and a main organic light-emitting diode OLEDm connected thereto that are arranged in the display area DA of the display panel 10, and an auxiliary subpixel Pa may include the auxiliary thin-film transistor TFTa and an auxiliary organic light-emitting diode OLEDa connected thereto that are arranged in the component area CA. The main subpixel Pm may correspond to a portion of the first pixel group PG1 of FIG. 1A, and the auxiliary subpixel Pa may correspond to a portion of the second pixel group PG2 of FIG. 1A.

The transmission portion TA in which no display elements are arranged may be arranged in the component area CA. The transmission portion TA may correspond to an area through which light or signals emitted from the component COMP is/are arranged in the component area CA or light or signals incident onto the component COMP is/are transmitted.

A bottom metal layer BML may be arranged in the component area CA. The bottom metal layer BML may be arranged to correspond to the lower portion of the auxiliary thin-film transistor TFTa. The bottom metal layer BML may prevent external light from reaching the auxiliary thin-film transistor TFTa. According to some embodiments, a static voltage or a signal is applied to the bottom metal layer BML to prevent a pixel circuit (e.g., the pixel circuit of the auxiliary thin-film transistor TFTa) from being damaged by electrostatic discharge. A plurality of bottom metal layers BML may be arranged in the component area CA. In some cases, different voltages may be applied to the bottom metal layers BML. According to one embodiment, one bottom metal layer BML having a hole corresponding to the transmission portion TA may be arranged in the component area CA.

The display element layer EDL may be covered with the thin-film encapsulation layer TFEL or the encapsulation substrate ENS. The thin-film encapsulation layer TFEL may include at least one inorganic encapsulation layer and at least one organic encapsulation layer. According to the embodiment illustrated in FIG. 2A, the thin-film encapsulation layer TFEL may include a first inorganic encapsulation layer 131, an organic encapsulation layer 132, and a second inorganic encapsulation layer 133.

Figure 2A:
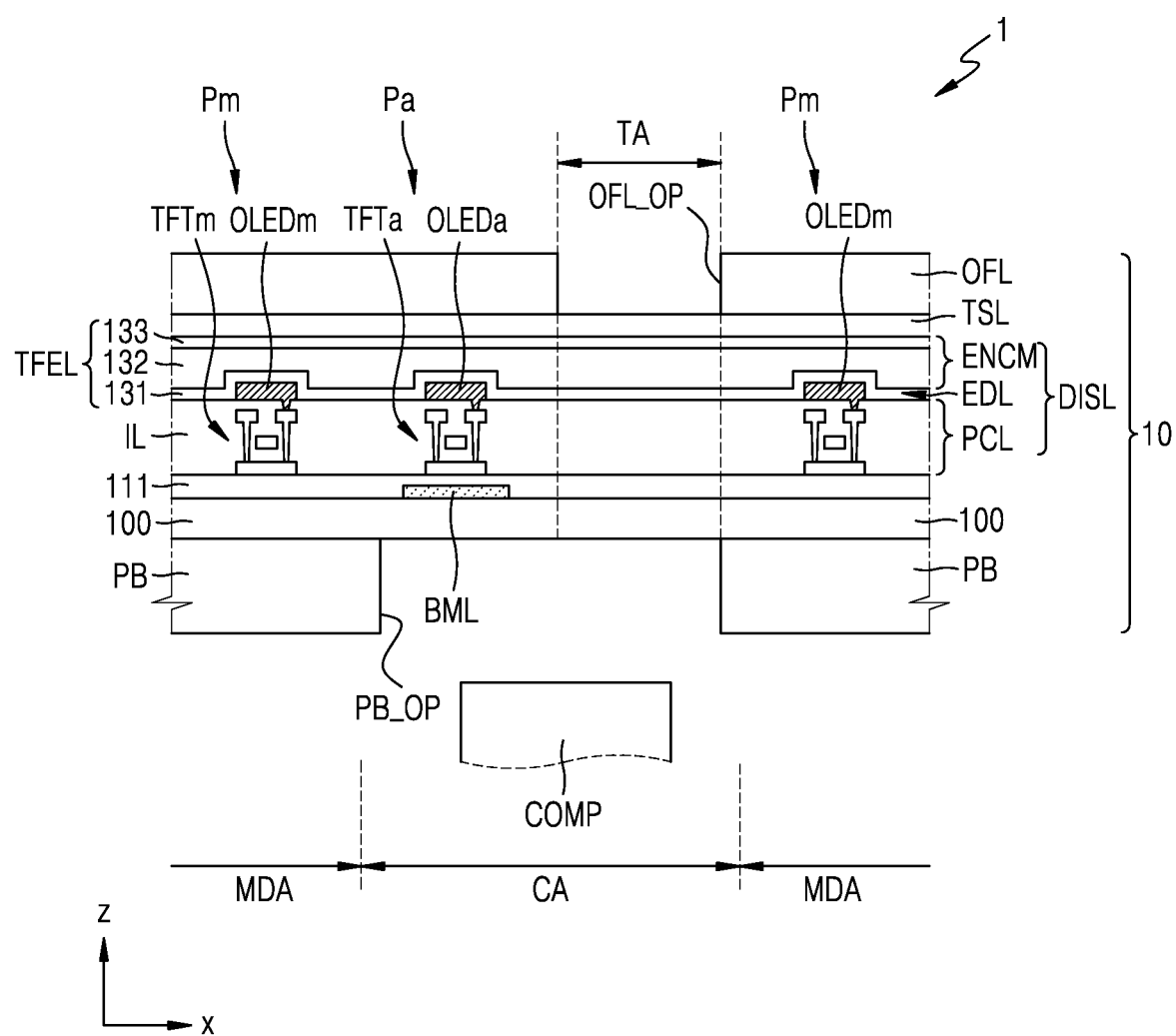
FIGS. 2A, 2B, 2C, and 2D are schematic cross-sectional views of a portion of a display device, according to an embodiment.
Figure 2B:
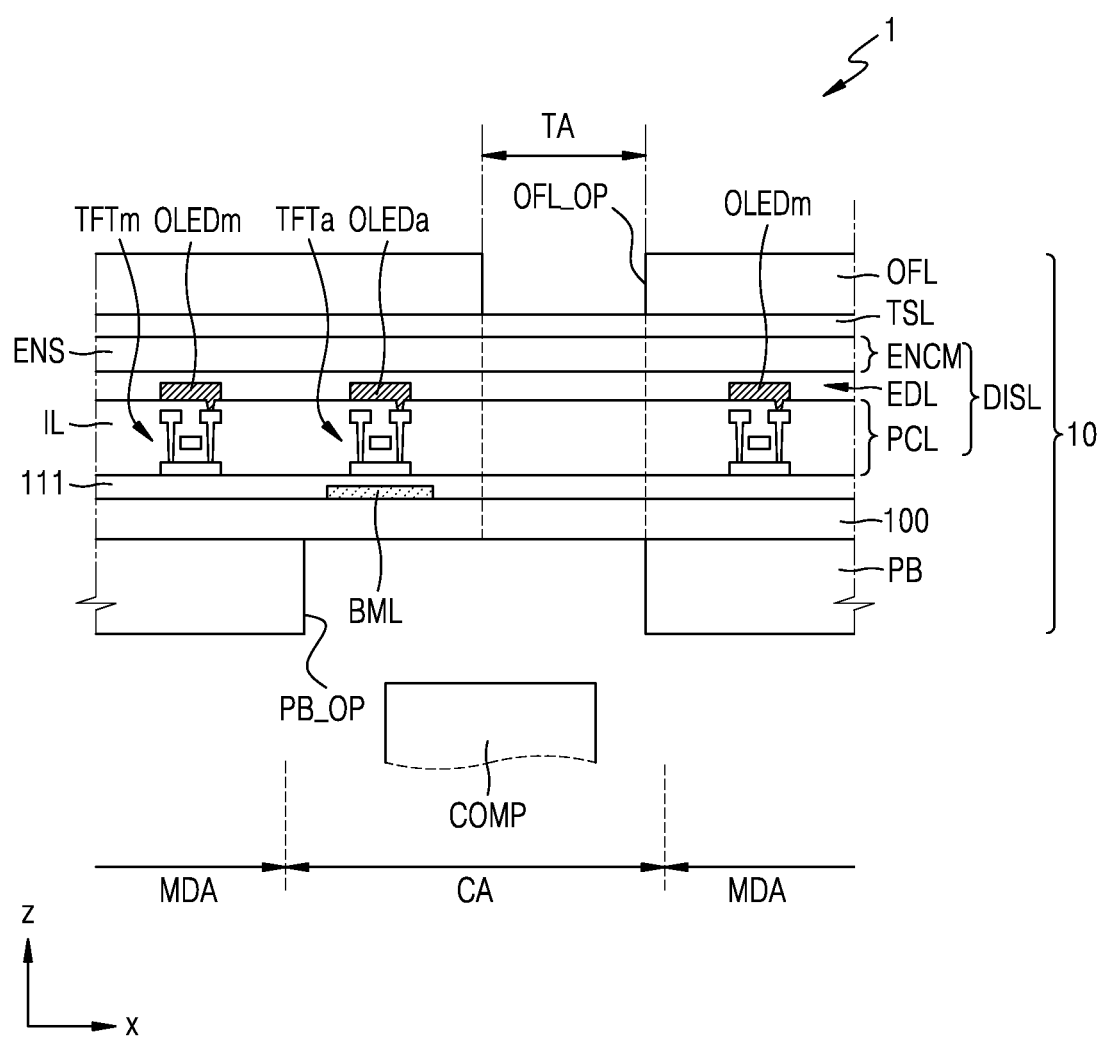

According to the embodiment illustrated in FIG. 2B, the encapsulation substrate ENS may be arranged to face the substrate 100 with the display element layer EDL interposed therebetween. A gap may exist between the encapsulation substrate ENS and the display element layer EDL. The encapsulation substrate ENS may include glass. A sealant including a frit or the like may be arranged between the substrate 100 and the encapsulation substrate ENS, and the sealant may be arranged in the non-display area NDA of the display panel 10 that is illustrated in FIG. 1A. The sealant arranged in the non-display area NDA may surround the display area DA and prevent moisture from being infiltrating through a side surface of the substrate 100. According to some embodiments, both of the thin-film encapsulation layer TFEL of FIG. 2A and the encapsulation substrate ENS of FIG. 2B may be arranged simultaneously.

The touch-sensing layer TSL may sense coordinate information according to an external input, for example, a touch event. The touch-sensing layer TSL may include a touch electrode and touch lines connected to the touch electrode. The touch-sensing layer TSL may sense the external input using various sensing methods, for example, but not limited to a self-capacitance method or a mutual-capacitance method.

The touch-sensing layer TSL may be arranged on the thin-film encapsulation layer TFEL. Alternatively, the touch-sensing layer TSL may be separately formed on a touch substrate (not illustrated) and bonded to the thin-film encapsulation layer TFEL using an adhesive layer such as an optically clear adhesive (OCA). According to an embodiment, as illustrated in FIGS. 2A to 2D, the touch-sensing layer TSL may be directly arranged on the thin-film encapsulation layer TFEL. In this case, the adhesive layer may not be arranged between the touch-sensing layer TSL and the thin-film encapsulation layer TFEL.

The optical functional layer OFL may include an anti-reflective layer. The anti-reflective layer may reduce a reflectance of light (e.g., external light) incident from the outside onto the display device 1.

According to some embodiments, the optical functional layer OFL may include a polarizing film. The optical functional layer OFL may include an opening OFL_OP that corresponds to the transmission portion TA. Therefore, the light transmittance of the transmission portion TA may be remarkably improved. The opening OFL_OP corresponding to the transmission portion TA may be filled with a transparent material such as an optically clear resin (OCR).

Figure 2C:
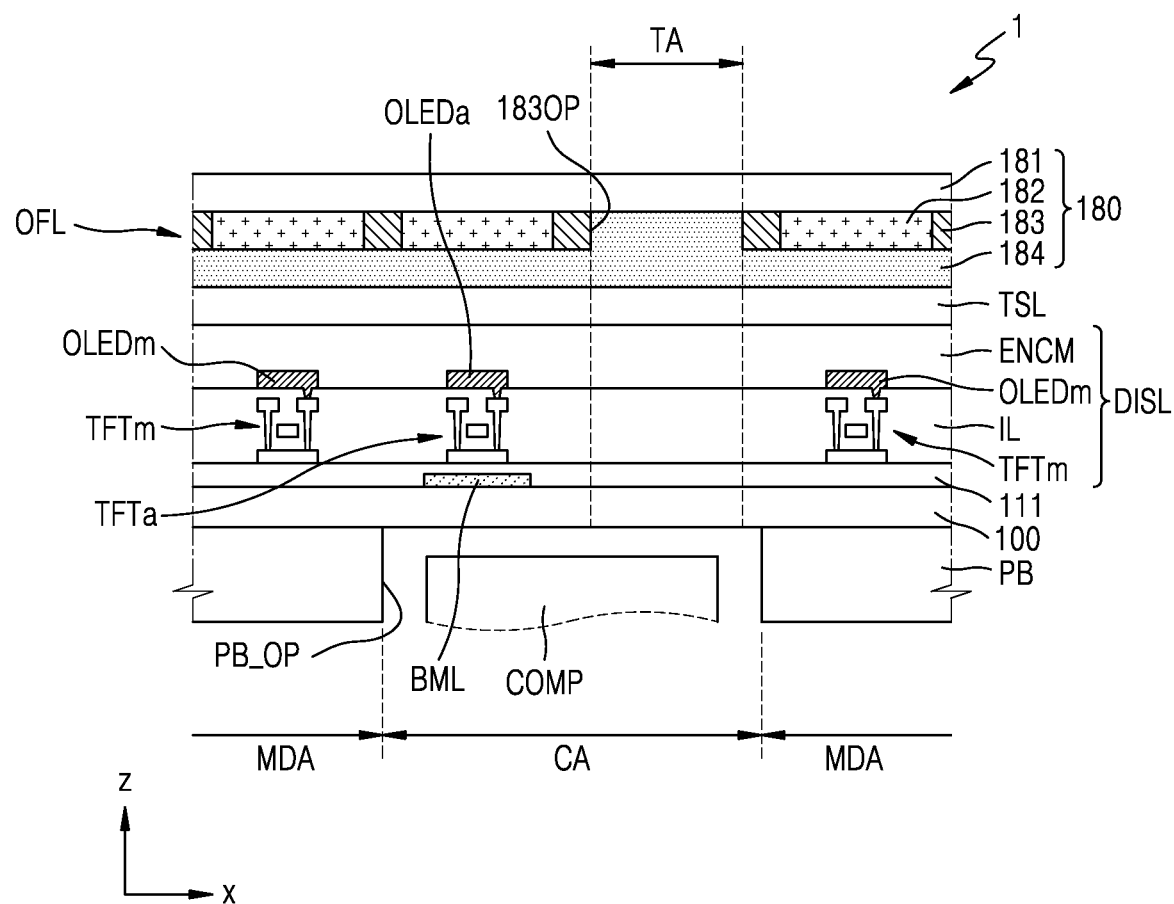

According to one embodiment, as illustrated in FIG. 2C, the optical functional layer OFL may include a filter plate 180 including a black matrix and one or more color filters. For example, the filter plate 180 may include a base layer 181, and a plurality of color filters 182, a black matrix 183, and an overcoat layer 184 arranged on the base layer 181.

The color filters 182 may be arranged based on a color of light emitted from the corresponding pixel of the display panel 10. For example, the color filter 182 may have a red color, a green color, or a blue color according to the color of light emitted from the organic light-emitting diodes OLEDm and OLEDa. The color filter 182 and the black matrix 183 may not be arranged in the transmission portion TA. For example, the layer including the color filter 182 and the black matrix 183 may include an opening 183OP that corresponds to the transmission portion TA. A portion of the overcoat layer 184 may be at least partially filled in the opening 183OP. The overcoat layer 184 may include an organic material such as a resin, and the organic material may be transparent.

Figure 2D:
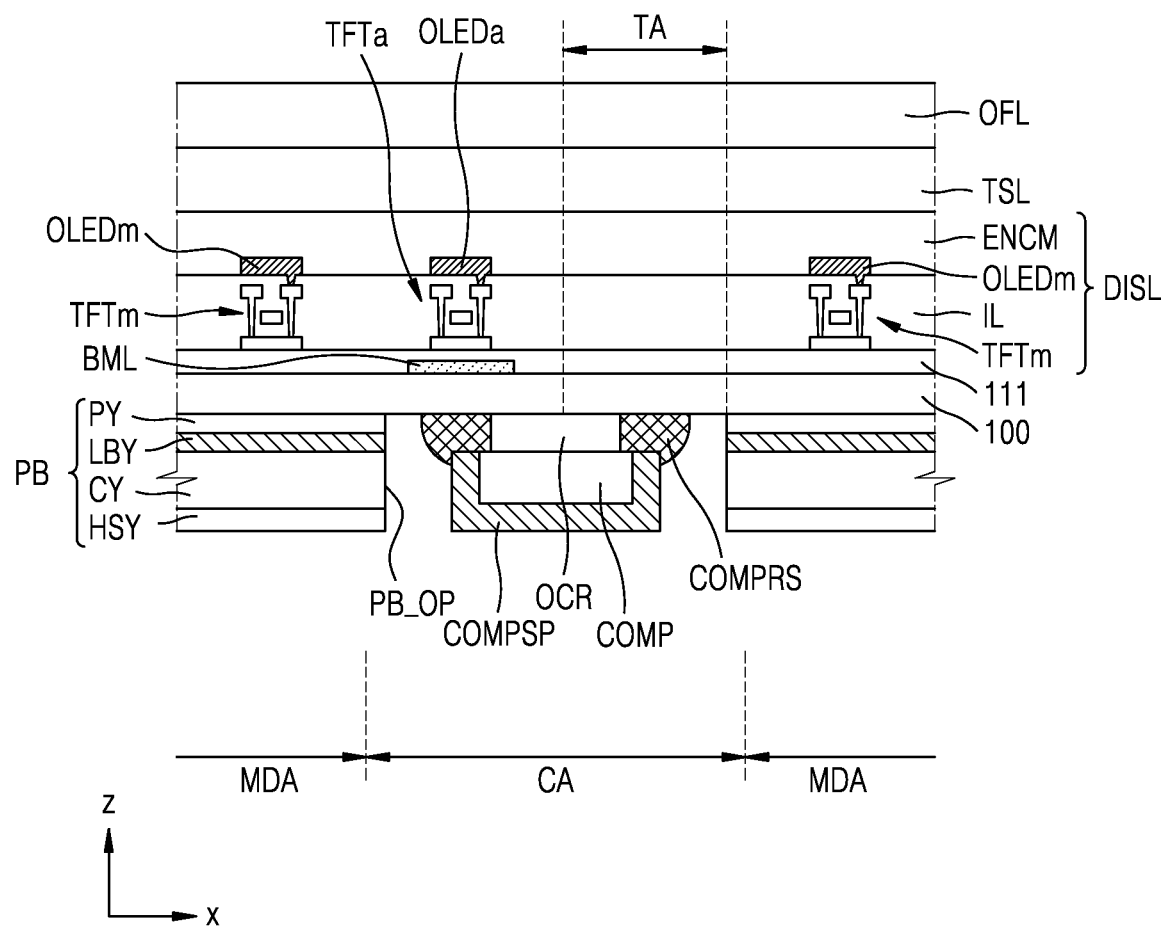

According to some embodiments, the component COMP may be attached to the lower portion of the display panel 10. As illustrated in FIG. 2D, the panel protection member PB may include a protective layer PY, a light blocking layer LBY, a cushion layer CY, and a heat sink layer HSY. The protective layer PY may be attached to the lower surface of the substrate 100 and may protect the substrate 100 from the outside. For example, the protective layer PY may absorb a physical impact from the outside or may prevent a foreign matter or moisture from being infiltrated into the display layer DISL. The protective layer PY may be coated on the lower surface of the substrate 100, or may be attached to the lower surface of the substrate 100 in the form of a film.

According to an embodiment, the protective layer PY may include a material that blocks ultraviolet (UV) rays. For example, the protective layer PY may include a base resin, an UV absorber, and inorganic particles. The UV absorber and the inorganic particles may be dispersed in the base resin. The base resin may include an acrylate-based resin, for example, urethane acrylate. However, the present disclosure is not limited thereto, and the protective layer PY may include the base resin that is optically transparent and capable of dispersing the UV absorber and the inorganic particles without deviating from the scope of the present disclosure.

For example, the UV absorber may include at least one compound selected from a benzotriazol-based compound, a benzophenone-based compound, a salicylic acid-based compound, a salicylate-based compound, a cyanoacrylate-based compound, a cinnamate-based compound, an oxanilide-based compound, a polystyrene-based compound, an azomethine-based compound, and a triazine-based compound.

The light blocking layer LBY may be arranged under the protective layer PY, and the cushion layer CY may be arranged under the light blocking layer LBY. The light blocking layer LBY may include an adhesive between the protective layer PY and the cushion layer CY. Also, the light blocking layer LBY may be provided as a black layer that is capable of absorbing external light. As such, the light blocking layer LBY may include various materials capable of absorbing external light.

The cushion layer CY may be attached to the lower surface of the light blocking layer LBY and may protect the display panel 10 from the outside. The cushion layer CY may include an elastic material, for example, a sponge or a rubber.

The heat sink layer HSY may be arranged under the cushion layer CY. The heat sink layer HSY may include a first heat sink layer including graphite or carbon nanotubes, and a second heat sink layer capable of shielding electromagnetic waves and including a metal thin-film that has excellent thermal conductivity, such as copper, nickel, ferrite, or silver.

The panel protection member PB may include an opening PB_OP that corresponds to the component area CA, and the component COMP may be arranged to overlap at least partially the opening PB_OP.

The component COMP may be mounted on a package COMPSP, and the package COMPSP may be attached to the lower surface of the substrate 100 by an adhesive member COMPRS. The package COMPSP may include a control circuit that is electrically connected to the component COMP.

According to an embodiment, an optically clear resin OCR may be filled between the component COMP and the lower surface of the substrate 100. The optically clear resin OCR has optical transparency and is capable of minimizing the loss of light incident onto the component COMP.

The adhesive member COMPRS may fix the package COMPSP to the lower surface of the substrate 100. The adhesive member COMPRS may include a resin. After the resin is arranged to contact the package COMPSP and the lower surface of the substrate 100, a curing operation using UV rays may be performed. The adhesive member COMRS may include a light absorbing material.

Alternatively, according to some embodiments, the component COMP may be arranged to be spaced apart from the display panel 10, as illustrated in FIGS. 2A to 2C. In this case, the component COMP may be attached and fixed to a lower cover of the display device 1 or the like.

The component COMP may include an electronic element using light or sound. For example, the electronic element may include a sensor (e.g., a proximity sensor) that measures a distance, a biometric sensor that recognizes a part of a user's body (e.g., a fingerprint, an iris, a face, etc.), a small lamp that outputs light, an image sensor (e.g., a camera) that captures an image, and the like. The electronic element that uses light may use light of various wavelength bands, such as visible light, infrared light, or ultraviolet light. The electronic element that uses sound may use ultrasonic waves or sounds of various frequency bands.

According to some embodiments, the component COMP may include sub-components such as a light-emitting portion and a light-receiving portion. The light-emitting portion and the light-receiving portion may have an integrated structure or a physically separated structure, and a pair of the light-emitting portion and the light-receiving portion may constitute one component COMP.

Figure 3:
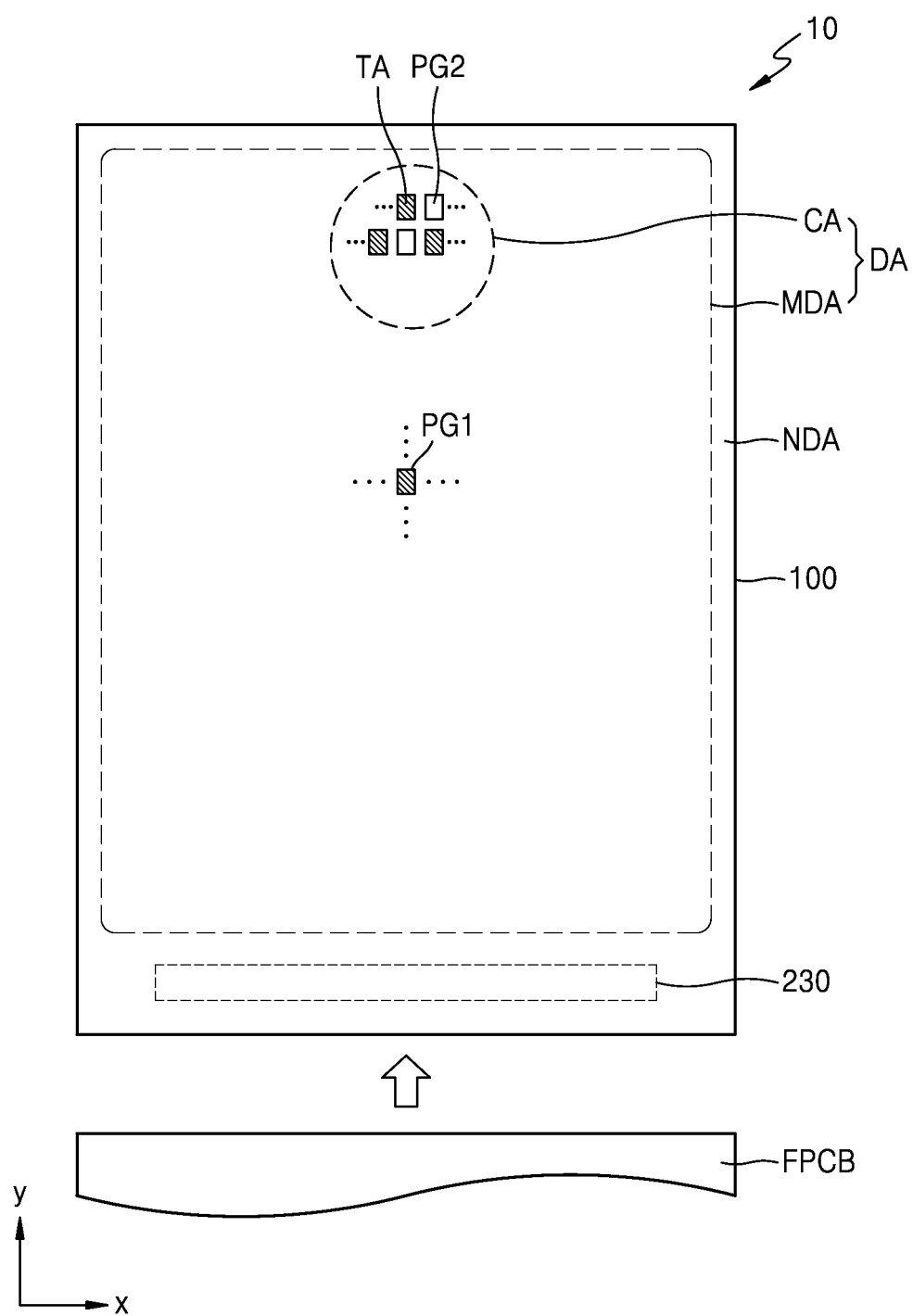
FIG. 3 is a schematic plan view of a display panel according to an embodiment.

FIG. 3 is a schematic plan view of the display panel 10 according to an embodiment.

Referring to FIG. 3, the display panel 10 may include a plurality of pixel groups on the substrate 100. The substrate 100 may include the display area DA and the non-display area NDA, and the display area DA may include the main display area MDA and the component area CA. In the present embodiment, the component area CA is completely surrounded by the main display area MDA, but it is noted that the present disclosure is not limited thereto.

One or more first pixel groups PG1 may be arranged in the main display area MDA, and one or more second pixel group PG2 and the transmission portion TA may be arranged in the component area CA.

The first pixel groups PG1 may be two-dimensionally arranged in the main display area MDA, and the second pixel groups PG2 and transmission portions TA may be two-dimensionally arranged in the component area CA.

Each of the main subpixel Pm of the first pixel group PG1 and the auxiliary subpixel Pa of the second pixel group PG2 may emit light of a certain color using organic light-emitting diodes. Each of the organic light-emitting diodes may emit, for example, red light, green light, or blue light. Each of the organic light-emitting diodes may be connected to a corresponding pixel circuit (not shown) including a thin-film transistor and a storage capacitor.

The non-display area NDA may completely surround the display area DA. A scan driver (not shown), a data driver (not shown), and/or the like may be arranged in the non-display area NDA. A pad portion 230 may be arranged in the non-display area NDA. The pad portion 230 may be arranged adjacent to an edge of one side of the substrate 100. The pad portion 230 may be exposed without being covered with an insulating layer (not shown) and may be electrically connected to a flexible printed circuit board FPCB. The flexible printed circuit board FPCB may electrically connect a controller (not shown) to the pad portion 230 and may supply signals and/or power transmitted from the controller. According to some embodiments, a data driver may be arranged on the flexible printed circuit board FPCB. In order to transmit signals or voltages from the flexible printed circuit board FPCB to the first pixel group PG1 and the second pixel group PG2, the pad portion 230 may be connected to a plurality of lines (not shown).

Figure 4:
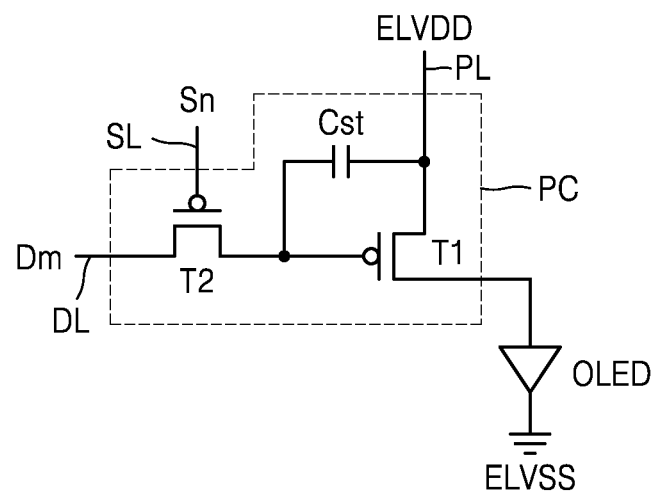
FIG. 4 is an equivalent circuit diagram of a pixel circuit connected to an organic light-emitting diode of a display device, according to an embodiment.

FIG. 4 is an equivalent circuit diagram of a pixel circuit PC connected to an organic light-emitting diode OLED of the display device 1, according to an embodiment.

Referring to FIG. 4, the organic light-emitting diode OLED may be electrically connected to the pixel circuit PC. The pixel circuit PC may include a driving thin-film transistor T1, a switching thin-film transistor T2, and a storage capacitor Cst.

The switching thin-film transistor T2 may be connected to a scan line SL and a data line DL and may be configured to transmit, to the driving thin-film transistor T1, a data voltage or a data signal Dm that is input from the data line DL according to a switching voltage or a switching signal Sn that is input from the scan line SL. The storage capacitor Cst may be connected to the switching thin-film transistor T2 and a driving voltage line PL, and may be configured to store a voltage corresponding to a difference between the voltage transmitted from the switching thin-film transistor T2 and a first power supply voltage ELVDD (also referred to as a driving voltage) that is supplied to the driving voltage line PL.

The driving thin-film transistor T1 may be connected to the driving voltage line PL and the storage capacitor Cst and may be configured to control a driving current flowing from the driving voltage line PL to the organic light-emitting diode OLED according to the voltage stored in the storage capacitor Cst. The organic light-emitting diode OLED may emit light having a certain luminance according to driving current. An opposite electrode (e.g., a cathode) of the organic light-emitting diode OLED may be configured to receive a second power supply voltage ELVSS.

Although FIG. 4 illustrates that the pixel circuit PC includes two thin-film transistors T1 and T2 and one storage capacitor Cst, the number of thin-film transistors and the number of storage capacitors may be variously changed according to the design of the pixel circuit PC without deviating from the scope of the present disclosure. For example, the pixel circuit PC may include three or more thin-film transistors.

Figure 5A:
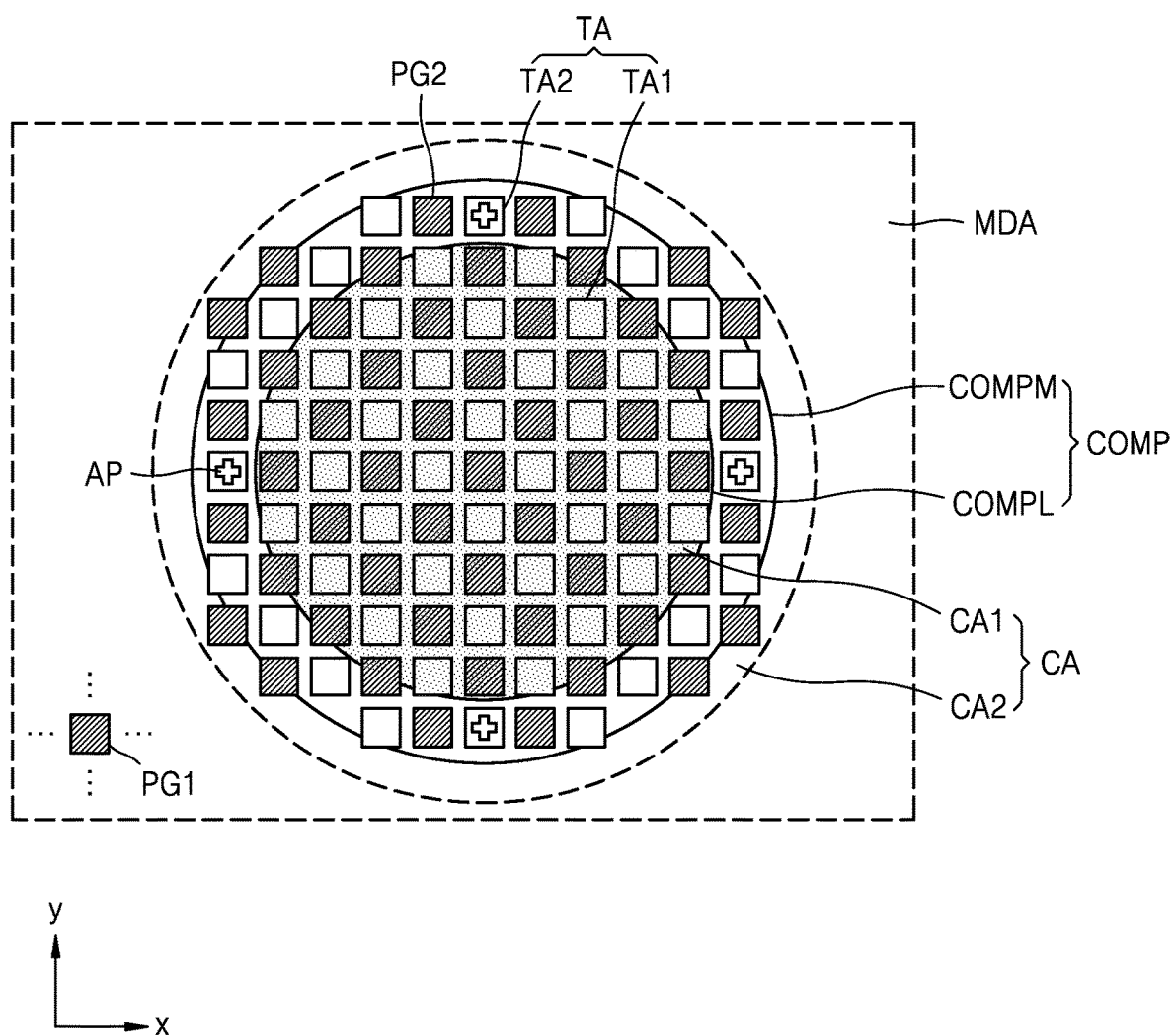
FIGS. 5A and 5B are plan views of a portion of a display panel and a portion of a component, according to an embodiment.
Figure 5B:
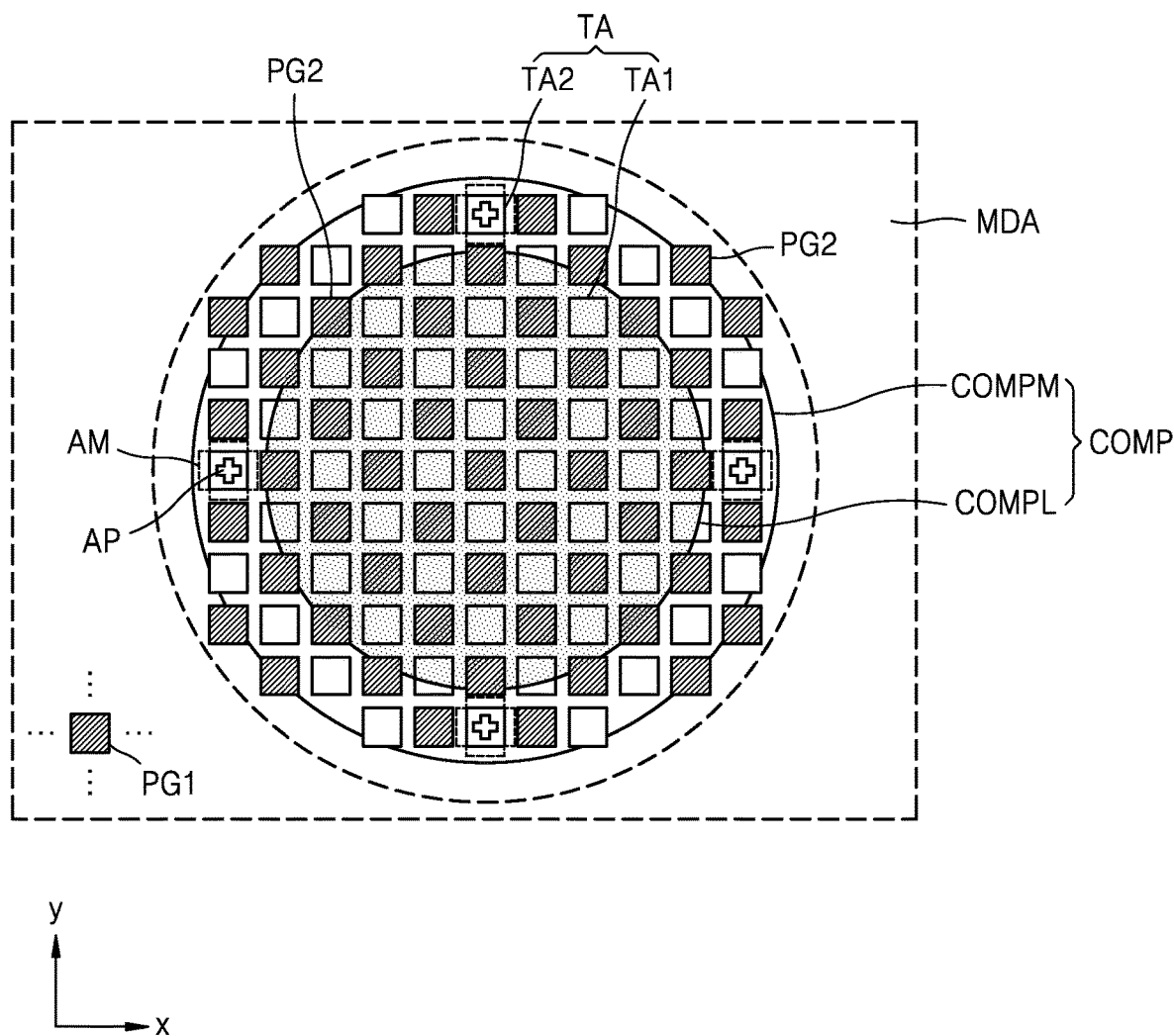

FIGS. 5A and 5B are plan views of a portion of the display panel 10 and a portion of the component COMP, according to an embodiment.

Referring to FIGS. 5A and 5B, the display device 1 may include the display panel 10 including pixel groups on the substrate 100 and the component COMP under the display panel 10. The substrate 100 may include the display area DA and the non-display area NDA, and the display area DA may include the main display area MDA and the component area CA. The first pixel group PG1 may be arranged in the main display area MDA, and the second pixel group PG2 and the transmission portion TA may be arranged in the component area CA. A plurality of transmission portions TA may be arranged in the component area CA. The second pixel group PG2 and the transmission portion TA may be alternately arranged in the x direction and/or the y direction, and may be arranged in, for example, a grid shape. The plurality of second pixel groups PG2 and the plurality of transmission portions TA may be arranged in the component area CA.

In the present embodiment, the component COMP may include a lens COMPL and a module COMPM. External light may be incident onto the component COMP through the lens COMPL, and light emitted from the component COMP may be transmitted through the lens COMPL. Specifically, light transmitted through the transmission portion TA may be incident onto the lens COMPL of the component COMP, and light emitted from the component COMP may be transmitted through the lens COMPL of the component COMP and the transmission portion TA.

The lens COMPL may be arranged in the module COMPM. The module COMPM may surround the lens COMPL. The module COMPM may correspond to the remaining portion of the component COMP that is connected to the lens COMPL. For example, the module COMPM may include a frame. For example, the frame may have a hollow cylinder shape. The lens COMPL may be connected to the frame. In this case, light transmitted through the lens COMPL may also be transmitted through the frame. Also, the module COMPM may include a charge coupled device (CCD) sensor. The CCD sensor may include a plurality of diodes (not shown), and light transmitted through the frame may reach the diodes of the CCD sensor.

The component area CA may include a first component area CA1 and a second component area CA2. The second component area CA2 may surround the first component area CA1. For example, the second component area CA2 may be arranged between the first component area CA1 and the main display area MDA.

In the present embodiment, the first component area CA1 may overlap the lens COMPL. The first component area CA1 may correspond to an area overlapping the lens COMPL. The first component area CA1 may include a first transmission portion TA1, and light transmitted through the first transmission portion TA1 may be transmitted to the component COMP through the lens COMPL. Also, the second pixel group PG2 may be arranged in the first component area CA1.

According to an embodiment, at least a portion of the second component area CA2 may be surrounded by the main display area MDA. For example, the second component area CA2 may be completely surrounded by the main display area MDA.

The second component area CA2 may at least partially overlap the module COMPM. The second component area CA2 may correspond to a portion of the component area CA that does not overlap the lens COMPL. The second component area CA2 may include a second transmission portion TA2. Also, the second pixel group PG2 may be arranged in the second component area CA2. According to some embodiments, the second pixel group PG2 may overlap both the first component area CA1 and the second component area CA2. That is, the second pixel group PG2 overlapping the outer periphery of the lens COMPL among the second pixel groups PG2 may overlap both the first component area CA1 and the second component area CA2. Similarly, some transmission portions TA may overlap the outer periphery of the lens COMPL, and these transmission portions TA may overlap both the first component area CA1 and the second component area CA2.

In the present embodiment, a plurality of second transmission portions TA2 may be provided in the second component area CA2. In this case, an alignment pattern AP may be arranged in at least some of the second transmission portions TA2. According to an embodiment, one or more alignment patterns AP may be arranged in the second transmission portions TA2. FIGS. 5A and 5B illustrate that four alignment patterns AP are arranged in the second transmission portion TA2 as an example, but in other embodiments, two or three alignment patterns AP may be arranged in the second transmission portion TA2, or five or more alignment patterns AP may be arranged in the second transmission portion TA2.

According to an embodiment, the alignment patterns AP may be symmetrically arranged around the first component area CA1. For example, the alignment patterns AP may be arranged to be spaced apart from each other in the second component area CA2 in the x direction and/or the y direction with the first component area CA1 interposed therebetween. Alternatively, according to another embodiment, the alignment patterns AP may form a virtual polygon when the centers of the alignment patterns AP are connected to each other. In this case, the center of the polygon may substantially coincide with the center of the first component area CA1. For example, virtual line segments of the virtual polygon that connect the centers of the alignment patterns AP of FIGS. 5A and 5B may form a rhombus, and the center of the rhombus may substantially coincide with the center of the first component area CA1.

The alignment pattern AP may have various shapes. For example, the alignment pattern AP may have a cross shape. As another example, the alignment pattern AP may have a polygonal shape, a circular shape, or an elliptical shape.

In the present embodiment, the transmitting portion TA and the second pixel group PG2 may be arranged in the component area CA, and light or sound may be incident onto or emitted from the component COMP through the transmitting portion TA. Also, in the present embodiment, the alignment pattern AP may be arranged in the second transmission portion TA2, and the component COMP may be aligned with the component area CA with respect to the alignment pattern AP.

According to some embodiments, the alignment pattern AP may be arranged in the first transmission portion TA1 of the first component area CA1. Hereinafter, the case in which the alignment pattern AP is arranged in the second transmission portion TA2 of the second component area CA2 will be described in detail.

Referring to FIG. 5A, the component area CA and the component COMP may be aligned with each other with respect to the outer periphery of the lens COMPL and the alignment patterns AP that are arranged in the second transmission portion TA2.

Alternatively, referring to FIG. 5B, the module COMPM may include one or more alignment marks AM. For example, the alignment marks AM may be arranged on the frame of the module COMPM. In this case, similar to the alignment patterns AP, the alignment marks AM may have various shapes. According to an embodiment, the alignment marks AM may overlap the alignment patterns AP. In this case, the component area CA and the component COMP may be aligned with each other with respect to the alignment patterns AP that are arranged in the second transmission portion TA2 and the alignment marks AM of the module COMPM.

The alignment patterns AP that are arranged in the second transmission portion TA2 may be used to accurately align the component area CA and the component COMP. For example, in the case in which the component COMP includes a CCD sensor, and the component area CA and the component COMP are not accurately aligned with each other, the number of diodes overlapping the transmission portions TA may not be uniform. In this case, even if the amount of light transmitted through each transmission portion TA is uniform, the amount of light reaching one diode may be different for each transmission portion TA. In the present embodiment, the alignment pattern AP may be arranged in at least one of the second transmission portions TA2 to precisely align the component area CA with the component COMP. Therefore, the same number of diodes may be overlapped in each transmission portion TA to provide a uniform amount of light reaching one or more diodes in each transmission portion TA.

According to an embodiment, the second pixel group PG2 and the transmission portion TA are alternately arranged in the component area CA in the x direction and/or the y direction, and a diffraction phenomenon may occur in each transmission portion TA. In the present embodiment, the component area CA and the component COMP are precisely aligned with each other, so that the same number of diodes may be overlapped in each transmission portion TA. Therefore, even if uniform light may be transmitted through each transmission portion TA to generate a diffraction phenomenon, the same number of diodes overlapped in each transmission portion TA may sense the same diffraction phenomenon. Therefore, the diffraction phenomenon may be equally corrected because the same number of diodes is overlapped in each transmission portion TA.

The alignment pattern AP may be a reference point for aligning the component area CA and the component COMP to minimize the diffraction phenomenon. For example, the relative positions of the component area CA and the component COMP may be changed based on the alignment pattern AP, and relative arrangement of the component area CA and the component COMP with respect to the alignment pattern AP may be set to minimize the diffraction phenomenon.

Also, when a focal length of the lens COMPL is changed, the alignment pattern AP may still be used as a reference point for aligning the component area CA and the component COMP to set the relative positions of the component area CA and the component COMP to minimize the diffraction phenomenon that may be caused by the change of the focal length of the lens COMPL.

Therefore, the diffraction phenomenon occurring in the transmission portion TA may be minimized even if the second pixel group PG2 and the transmission portion TA are alternately arranged in the component area CA. Also, in a case where the component COMP is a CCD sensor or a camera, the image quality deterioration of the camera may be minimized.

According to an embodiment, the alignment pattern AP may include the same material as that of a semiconductor layer or electrodes of a thin-film transistor connected to a display element. Alternatively, in a case where the display element is an organic light-emitting diode, the display element may include the same material as that of a pixel electrode. This will be described below in further detail with reference to FIGS. 8 to 12.

According to another embodiment, similar to the alignment pattern AP, an alignment reference serving as a reference point may be set in at least one of the second transmission portions TA2 in the second component area CA2. For example, a stack structure of the elements constituting at least one of the second transmission portions TA2 may be different from a stack structure of the elements constituting the first transmission portion TA1. Because the light transmittance of at least one of the second transmission portions TA2 is different from the light transmittance of the first transmission portion TA1 due to a difference of their stack structures, at least one of the second transmission portions TA2 may be used as a reference point like the alignment pattern AP. This will be described below with reference to FIGS. 13 to 16. First, a pixel arrangement structure in the main display area MDA and the component area CA will be described in detail with reference to FIGS. 6 and 7A to 7C.

Figure 6:
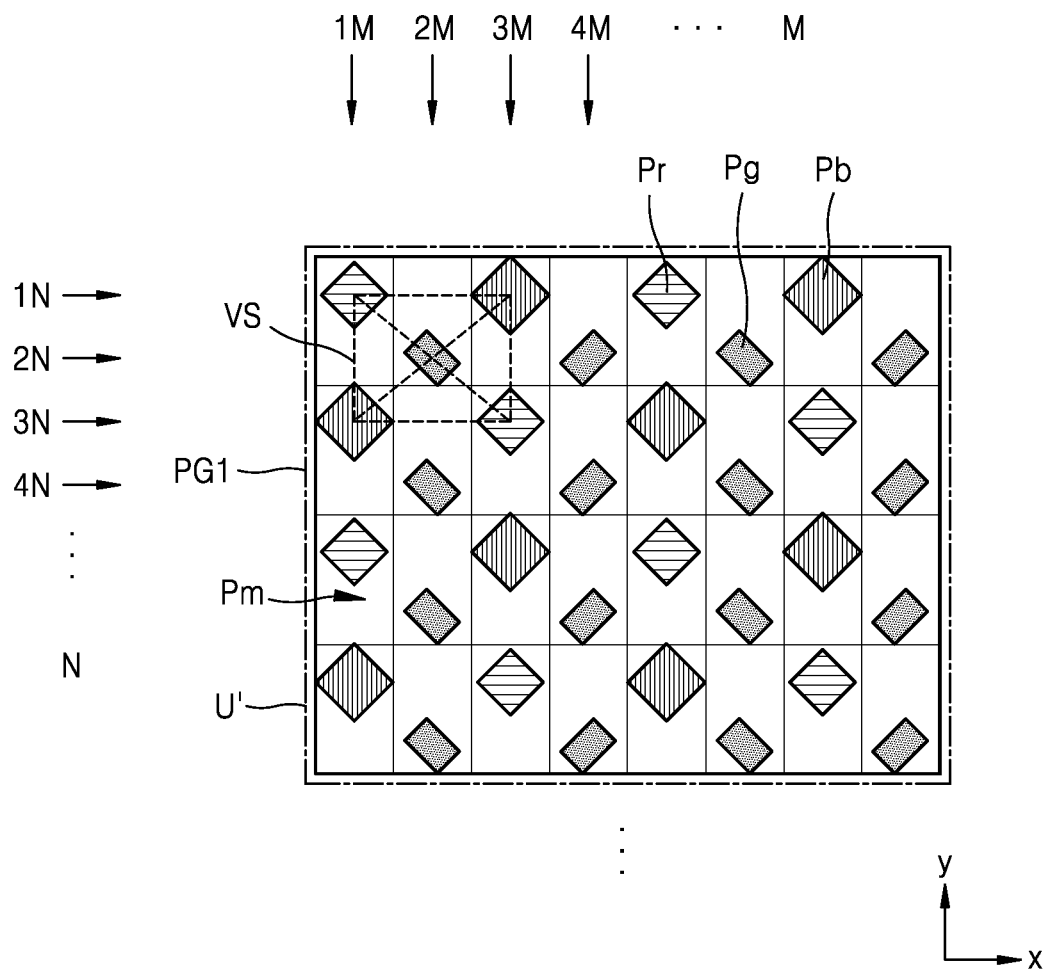
FIG. 6 is a schematic layout diagram of a pixel arrangement structure in a main display area, according to an embodiment.

FIG. 6 is a schematic layout diagram of a pixel arrangement structure in the main display area MDA, according to an embodiment.

Referring to FIG. 6, the first pixel group PG1 may be arranged in the main display area MDA. The first pixel group PG1 may correspond to a subpixel assembly in which a plurality of main subpixels Pm are grouped in preset units. The subpixel as used herein may refer to an emission area as a minimum unit for implementing an image. When an organic light-emitting diode is used as a display element, the emission area may correspond to an opening of a pixel defining layer.

According to an embodiment, a first pixel group PG1 may include 32 main subpixels Pm that are arranged in a PenTile structure. For example, one first pixel group PG1 may include eight red subpixels Pr, sixteen green subpixels Pg, and eight blue subpixels Pb. The red subpixel Pr, the green subpixel Pg, and the blue subpixel Pb may represent a red color, a green color, and a blue color, respectively.

A plurality of red subpixels Pr and a plurality of blue subpixels Pb may be alternately arranged in a first row 1N. A plurality of green subpixels Pg may be arranged to be spaced apart from each other at certain intervals in a second row 2N that is adjacent to the first row 1N. A plurality of blue subpixels Pb and a plurality of red subpixels Pr may be alternately arranged in a third row 3N that is adjacent to the second row 2N. A plurality of green subpixels Pg may be arranged to be spaced apart from each other at certain intervals in a fourth row 4N that is adjacent to the third row 3N. Such pixel arrangement in the pixel rows may be repeated up to an $N^{th}$ row. In this case, the blue subpixel Pb and the red subpixel Pr may have a size that is greater than the size of the green subpixel Pg.

The red subpixels Pr and the blue subpixels Pb arranged in the first row 1N and the green subpixels Pg arranged in the second row 2N may be alternately arranged. For example, the red subpixels Pr and the blue subpixels Pb may be alternately arranged in a first column 1M, and the green subpixels Pg may be arranged to be spaced apart from each other at certain intervals in a second column 2M that is adjacent to the first column 1M. The blue subpixels Pb and the red subpixels Pr may be alternately arranged in a third column 3M that is adjacent to the second column 2M. The green subpixels Pg may be arranged to be spaced apart from each other at certain intervals in a fourth column 4M that is adjacent to the third column 3M. Such pixel arrangement in the pixel columns may be repeated up to an Mth column.

The pixel arrangement structure may be expressed differently. For example, the red subpixels Pr are arranged at first and third vertices facing each other among the vertices of a virtual rectangle VS having the green subpixel Pg at a center point of a rectangle, and the blue subpixels Pb are arranged at second and fourth vertices facing each other. In this case, the virtual rectangle VS may be modified in various forms, such as a rectangle, a rhombus, and a square.

The pixel arrangement structure or the pattern of pixel arrangement illustrated in FIG. 6 is referred to as a PenTile matrix structure or a PenTile structure. By applying rendering, in which a color of a pixel is represented by sharing the colors of its adjacent pixels, a high resolution may be obtained using a small number of pixels.

Although FIG. 6 illustrates that the main subpixels Pm are arranged in the PenTile matrix structure, the present disclosure is not limited thereto. For example, the main subpixels Pm may be arranged in various shapes, such as a stripe structure, a mosaic arrangement structure, or a delta arrangement structure.

Figure 7A:
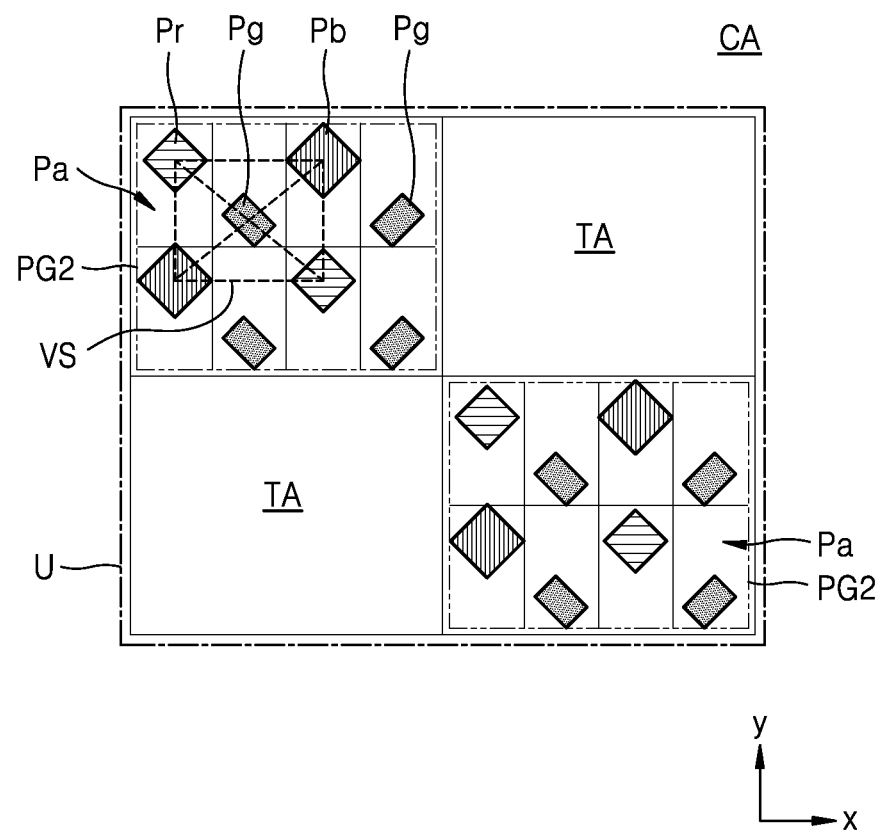
FIGS. 7A, 7B, and 7C are schematic layout diagrams of a pixel arrangement structure in a component area, according to various embodiments.
Figure 7B:
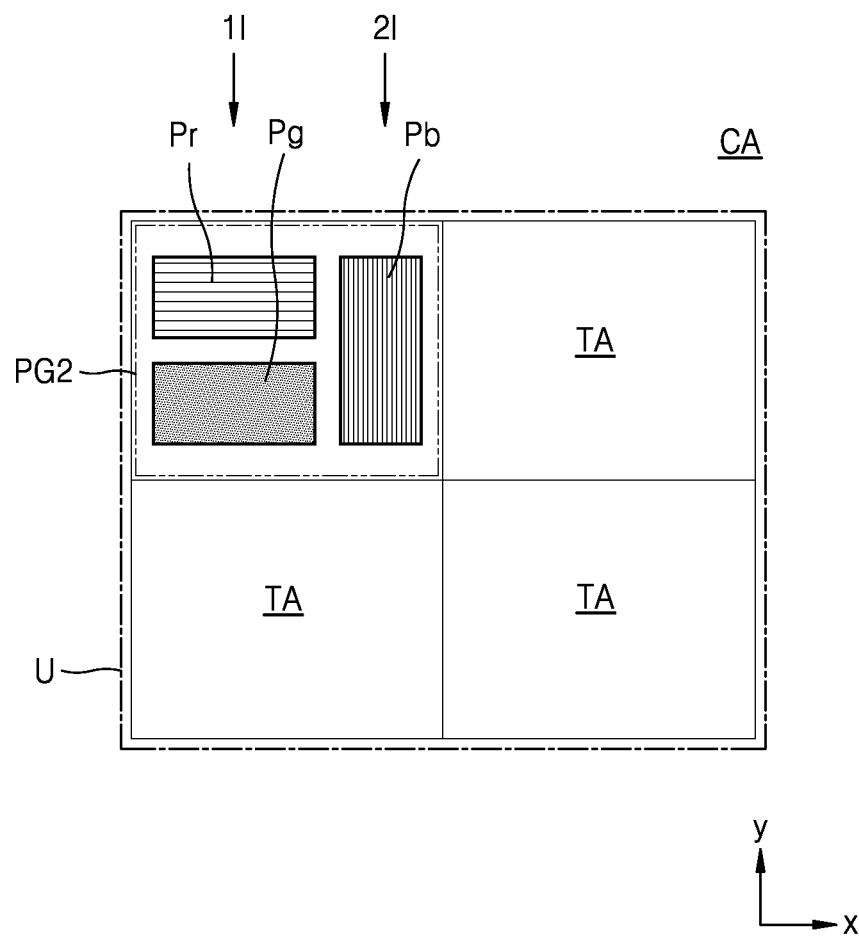
Figure 7C:
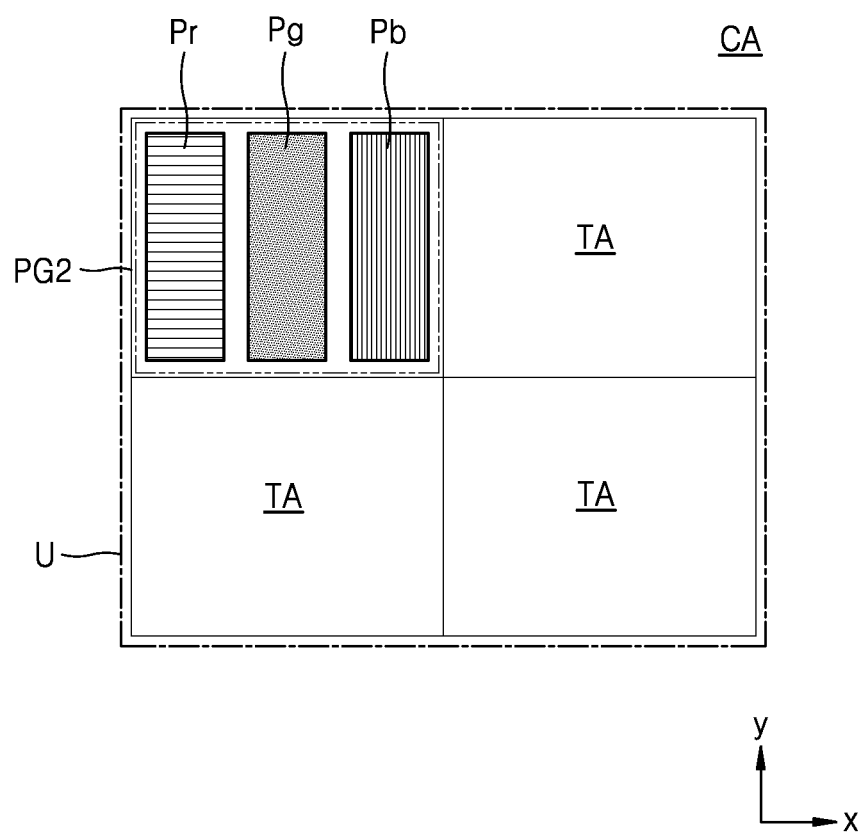

FIG. 7A to 7C are schematic layout diagrams of a pixel arrangement structure in the component area CA, according to various embodiments.

Referring to FIG. 7A, the second pixel group PG2 that includes at least one auxiliary subpixel Pa and the transmission portion TA may be arranged in the component area CA. The second pixel group PG2 and the transmission portion TA may be alternately arranged in the x direction and/or the y direction, and may be arranged in, for example, a grid shape. A plurality of second pixel groups PG2 and a plurality of transmission portions TA may be arranged in the component area CA.

The second pixel group PG2 may refer to a subpixel assembly in which a plurality of auxiliary subpixels Pa are grouped in preset units. For example, as illustrated in FIG. 7A, one second pixel group PG2 may include eight auxiliary subpixels Pa arranged in a PenTile structure. That is, one second pixel group PG2 may include two red subpixels Pr, four green subpixels Pg, and two blue subpixels Pb.

In the component area CA, a base unit U in which a certain number of second pixel groups PG2 and a certain number of transmission portions TA are grouped may be repeatedly arranged in the x direction and/or the y direction. In FIG. 7A, the base unit U may include two second pixel groups PG2 and two transmission portions TA arranged therearound that are grouped in a square shape. The base unit U may correspond to a division of a repetitive shape and does not necessarily imply disconnection of a structure.

Referring to FIGS. 6 and 7A, a base unit U' corresponding to the base unit U of the component area CA may be provided in the main display area MDA. The number of main subpixels Pm included in the base unit U' of the main display area MDA may be greater than the number of auxiliary subpixels Pa included in the base unit U of the component area CA. For example, the number of auxiliary subpixels Pa included in the base unit U is 16, and the number of main subpixels Pm included in the base unit U' is 32. Therefore, a ratio of the number of auxiliary subpixels Pa and the number of main subpixels Pm arranged per the same unit area may be 1:2.

The arrangement structure of the auxiliary subpixels Pa as illustrated in FIG. 7A is a PenTile structure. The pixel arrangement structure of the component area CA that has a half of the resolution of the main display area MDA may be referred to as a half PenTile structure. The number or arrangement of the auxiliary subpixels Pa included in the second pixel group PG2 may be modified and designed according to a resolution of the component area CA. For example, only one second pixel group PG2 may be included in the base unit U, and the remaining areas of the base unit U may be provided as the transmission portion TA. In this case, the ratio of the number of auxiliary subpixels Pa and the number of main subpixels Pm arranged per the same area may be 1:4.

Referring to FIG. 7B, the pixel arrangement structure of the component area CA may be provided in an S-stripe structure. In the present embodiment, each of the auxiliary subpixels Pa included in one second pixel group PG2 may include a total of three auxiliary subpixels Pa, that is, one red subpixel Pr, one green subpixel Pg, and one blue subpixels Pb.

The red subpixel Pr and the green subpixel Pg may be alternately arranged in a first column 11, and the blue subpixel Pb may be arranged in a second column 21 that is adjacent to the first column 11. The red subpixel Pr and the green subpixel Pg may have a rectangular shape having a long side in the x direction, and the blue subpixel Pb may have a rectangular shape having a long side in the y direction. The length of the blue subpixel Pb in the y direction may be equal to or greater than the sum of the length of the red subpixel Pr and the length of the green subpixel Pg in the y direction.

In the present embodiment, the area occupied by one second pixel group PG2 in the base unit U may be about a quarter of the area of the base unit U. FIG. 7B illustrates that the base unit U includes only one second pixel group PG2, but in another embodiment, the base unit U may include two or more second pixel groups PG2. Also, the areas of the auxiliary subpixels Pa included in the second pixel group PG2 and/or the location of the second pixel group PG2 in the base unit U may be variously changed.

Referring to FIG. 7C, the pixel arrangement structure of the component area CA may be provided in a stripe structure. Each of the auxiliary subpixels Pa included in one second pixel group PG2 may include a red subpixel Pr, a green subpixel Pg, and a blue subpixel Pb. The red subpixel Pr, the green subpixel Pg, and the blue subpixel Pb may be arranged side by side in the x direction. Each of the red subpixel Pr, the green subpixel Pg, and the blue subpixel Pb may have a long side in the y direction.

Alternatively, unlike the pixel arrangement structure illustrated in FIG. 7C, the red subpixel Pr, the green subpixel Pg, and the blue subpixel Pb may be arranged side by side in the y direction. In this case, each of the red subpixel Pr, the green subpixel Pg, and the blue subpixel Pb may have a long side in the x direction.

According to some embodiments, the first pixel group PG1 and the second pixel group PG2 having different pixel arrangements may be arranged in the component area CA. For example, the pixel arrangement structures described above with reference to FIGS. 7A to 7C may be applied to the first pixel group PG1 and the second pixel group PG2. For example, auxiliary subpixels Pa of the first pixel group PG1 may be arranged in a PenTile structure, and auxiliary subpixels Pa of the second pixel group PG2 may be arranged in a stripe structure. At least one of the first pixel group PG1 and the second pixel group PG2 may serve as a reference point to align the component area CA and the component COMP with each other, like the alignment pattern AP described above with reference to FIG. 5A.

Figure 8:
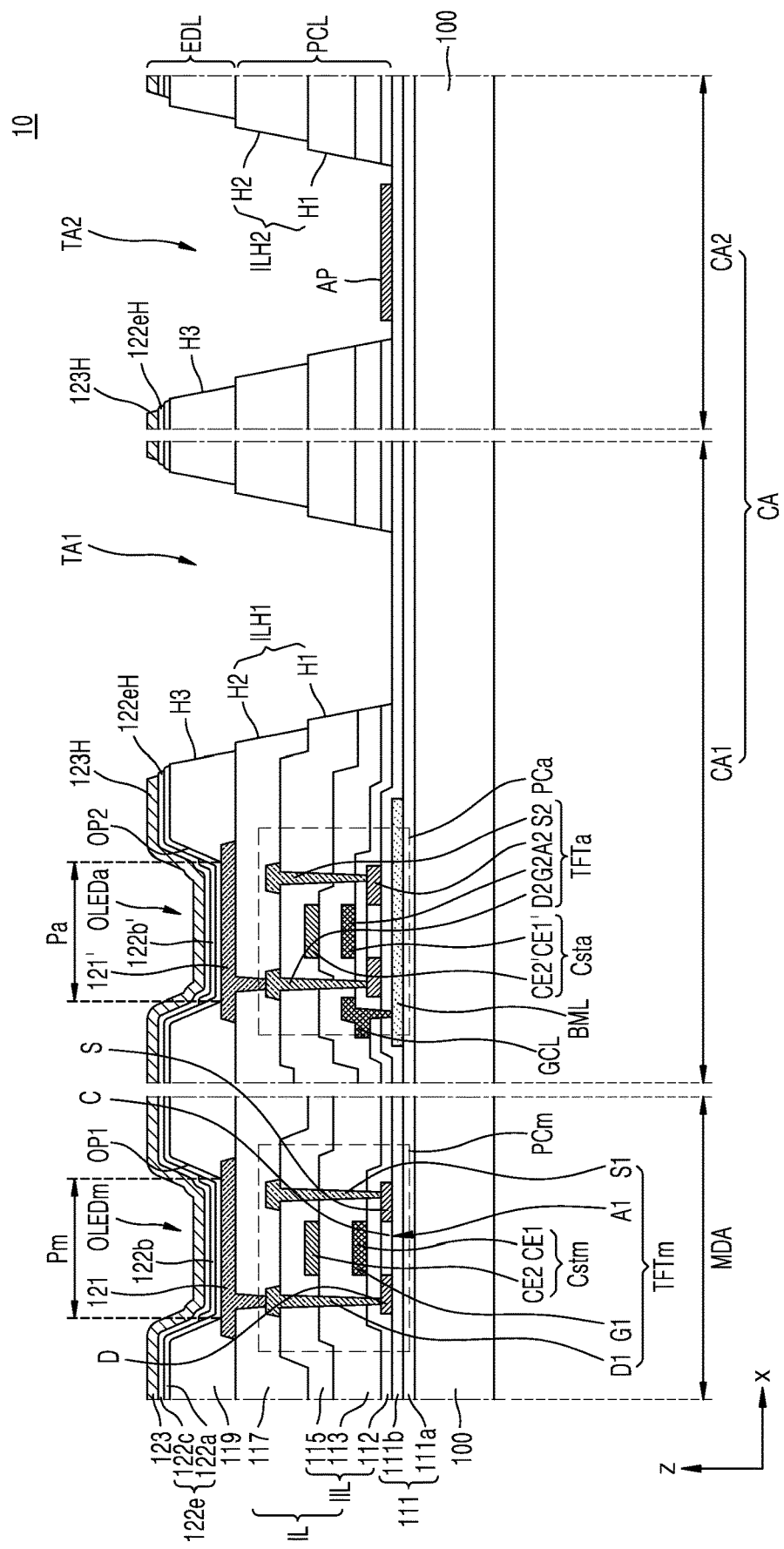
FIGS. 8, 9, 10, 11, and 12 are schematic cross-sectional views of a portion of a display panel, according to various embodiments.

FIGS. 8 to 12 are schematic cross-sectional views of a portion of the display panel 10, according to various embodiments. FIG. 8 is a schematic cross-sectional view of the main display area MDA and the component area CA. FIGS. 9 to 12 are schematic cross-sectional views of the first component area CA1 and the second component area CA2. In the second transmission portion TA2, an alignment pattern AP may be arranged among the second transmission portions TA2 arranged in the second component area CA2.

Referring to FIG. 8, the display panel 10 may include the main display area MDA and the component area CA. The main subpixel Pm may be arranged in the main display area MDA, and the auxiliary subpixel Pa may be arranged in the component area CA. The first transmission portion TA1 may be arranged in the first component area CA1, and the second transmission portion TA2 may be arranged in the second component area CA2.

A main pixel circuit PCm that includes a main thin-film transistor TFTm and a main storage capacitor Cstm, and the main organic light-emitting diode OLEDm as a display element connected to the main pixel circuit PCm may be arranged in the main display area MDA. An auxiliary pixel circuit PCa that includes an auxiliary thin-film transistor TFTa and an auxiliary storage capacitor Csta, and the auxiliary organic light-emitting diode OLEDa as a display element connected to the auxiliary pixel circuit PCa may be arranged in the component area CA.

Hereinafter, a structure in which elements included in the display panel 10 are stacked will be described. The display panel 10 may be provided by stacking the substrate 100, the buffer layer 111, the pixel circuit layer PCL, and the display element layer EDL.

The substrate 100 may include glass or a polymer resin, such as polyethersulfone, polyacrylate, polyetherimide, polyethylene naphthalate, polyethylene terephthalate, polyphenylene sulfide, polyimide, polycarbonate, cellulose triacetate, or cellulose acetate propionate. The substrate 100 including the polymer resin may be flexible, rollable, or bendable. The substrate 100 may have a multiple layer structure including a base layer (not illustrated) including the above-described polymer resin and a barrier layer (not illustrated).

The buffer layer 111 may be arranged on the substrate 100 and may reduce or prevent infiltration of a foreign material, moisture, or ambient air from below the substrate 100 and may provide a flat surface on the substrate 100. The buffer layer 111 may include an inorganic material, such as an oxide or nitride, an organic material, or an organic-inorganic composite material and may have a single layer structure or a multiple layer structure including at least one inorganic material and at least one organic material. A barrier layer (not illustrated) may be further included between the substrate 100 and the buffer layer 111 to prevent infiltration of ambient air. According to some embodiments, the buffer layer 111 may include silicon dioxide ($SiO_2$) or silicon nitride (SiN$_x$). The buffer layer 111 may have a structure in which a first buffer layer 111a and a second buffer layer 111b are stacked.

In the component area CA, a bottom metal layer BML may be arranged between the first buffer layer 111a and the second buffer layer 111b. According to another embodiment, the bottom metal layer BML may be arranged between the substrate 100 and the first buffer layer 111a. The bottom metal layer BML may be arranged under the auxiliary pixel circuit PCa to prevent characteristics of the auxiliary thin-film transistor TFTa from being degraded by light emitted from the component or the like. Also, the bottom metal layer BML may prevent light emitted from or directed to the component or the like from diffracting through narrow gaps between lines connected to the auxiliary pixel circuit PCa. The bottom metal layer BML may not be arranged in the first transmission portion TA1.

Also, the bottom metal layer BML may be connected to a line GCL arranged on another layer through a contact hole. The bottom metal layer BML may be configured to receive a static voltage or a signal from the line GCL. For example, the bottom metal layer BML may be configured to receive the first power supply voltage ELVDD or a scan signal. Because the bottom metal layer BML receives a constant voltage or a signal, the probability that electrostatic discharge occurs may be significantly reduced. The bottom metal layer BML may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu). The bottom metal layer BML may include a single layer or multiple layers including the above-described materials.

The pixel circuit layer PCL may be arranged on the buffer layer 111 and may include the main pixel circuit PCm, the auxiliary pixel circuit PCa, and an insulating layer IL. The insulating layer IL may include an inorganic insulating layer IIL and an organic insulating layer 117. The inorganic insulating layer IIL may include a first gate insulating layer 112, a second gate insulating layer 113, and an interlayer insulating layer 115. The main pixel circuit PCm may include the main thin-film transistor TFTm and the main storage capacitor Cstm, and the auxiliary pixel circuit PCa may include the auxiliary thin-film transistor TFTa and the auxiliary storage capacitor Csta.

The main thin-film transistor TFTm and the auxiliary thin-film transistor TFTa may be arranged on the buffer layer 111. The main thin-film transistor TFTm may include a first semiconductor layer A1, a first gate electrode G1, a first source electrode S1, and a first drain electrode D1, and the auxiliary thin-film transistor TFTa may include a second semiconductor layer A2, a second gate electrode G2, a second source electrode S2, and a second drain electrode D2. The main thin-film transistor TFTm may be connected to the main organic light-emitting diode OLEDm and may drive the main organic light-emitting diode OLEDm. The auxiliary thin-film transistor TFTa may be connected to the auxiliary organic light-emitting diode OLEDa and may drive the auxiliary organic light-emitting diode OLEDa.

The first semiconductor layer A1 and the second semiconductor layer A2 may be arranged on the buffer layer 111. According to an embodiment, the first and second semiconductor layers A1 and A2 may include polysilicon. According to another embodiment, the first and second semiconductor layers A1 and A2 may include amorphous silicon. According to another embodiment, the first and second semiconductor layers A1 and A2 may include an oxide of at least one material selected from indium (In), gallium (Ga), tin (Sn), zirconium (Zr), vanadium (V), hafnium (Hf), cadmium (Cd), germanium (Ge), chromium (Cr), titanium (Ti), and zinc (Zn). The first and second semiconductor layers A1 and A2 may include a channel region C, and a source region S and a drain region D that are doped with impurities.

The second semiconductor layer A2 may overlap the bottom metal layer BML with the second buffer layer 111b interposed therebetween. According to an embodiment, the width of the second semiconductor layer A2 may be less than the width of the bottom metal layer BML. In this case, the second semiconductor layer A2 may overlap the bottom metal layer BML as a whole in a direction perpendicular to the substrate 100.

The first gate insulating layer 112 may cover the first semiconductor layer A1 and the second semiconductor layer A2. The first gate insulating layer 112 may include an inorganic insulating material, such as silicon oxide (SiO$_2$), silicon nitride (SiN$_x$), silicon oxynitride (SiON), aluminum oxide (Al$_2$O$_3$), titanium oxide (TiO$_2$), tantalum oxide (Ta$_2$O$_5$), hafnium oxide (HfO$_2$), or zinc oxide (ZnO). The first gate insulating layer 112 may include a single layer or multiple layers including the above-described inorganic insulating materials.

The first gate electrode G1 and the second gate electrode G2 may be arranged above the first gate insulating layer 112 to overlap the first semiconductor layer A1 and the second semiconductor layer A2, respectively. The first gate electrode G1 and the second gate electrode G2 may include molybdenum (Mo), aluminum (Al), copper (Cu), titanium (Ti), or the like and may include a single layer or multiple layers. For example, the first gate electrode G1 and the second gate electrode G2 may include a single Mo layer.

The second gate insulating layer 113 may cover the first gate electrode G1 and the second gate electrode G2. The second gate insulating layer 113 may include an inorganic insulating material, such as silicon oxide (SiO$_2$), silicon nitride (SiN$_x$), silicon oxynitride (SiON), aluminum oxide (Al$_2$O$_3$), titanium oxide (TiO$_2$), tantalum oxide (Ta$_2$O$_5$), hafnium oxide (HfO$_2$), or zinc oxide (ZnO). The second gate insulating layer 113 may include a single layer or multiple layers including the above-described inorganic insulating materials.

A first upper electrode CE2 of the main storage capacitor Cstm and a second upper electrode CE2' of the auxiliary storage capacitor Csta may be arranged above the second gate insulating layer 113.

In the main display area MDA, the first upper electrode CE2 may overlap the first gate electrode G1. The first gate electrode G1 and the first upper electrode CE2 that overlap each other with the second gate insulating layer 113 interposed therebetween may constitute the main storage capacitor Cstm. The first gate electrode G1 may correspond to the first lower electrode CE1 of the main storage capacitor Cstm. For example, the first gate electrode G1 may be integrally provided with the first lower electrode CE1 of the main storage capacitor Cstm.

In the component area CA, the second upper electrode CE2' may overlap the second gate electrode G2. The second gate electrode G2 and the second upper electrode CE2' that overlap each other with the second gate insulating layer 113 interposed therebetween may constitute the auxiliary storage capacitor Csta. The second gate electrode G2 may correspond to a second lower electrode CE1' of the auxiliary storage capacitor Csta. For example, the second gate electrode G2 may be integrally provided with the second lower electrode CE1' of the auxiliary storage capacitor Csta.

The first upper electrode CE2 and the second upper electrode CE2' may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu) and may include a single layer or multiple layers including the above-described materials.

The interlayer insulating layer 115 may cover the first upper electrode CE2 and the second upper electrode CE2'. The interlayer insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO). The interlayer insulating layer 115 may include a single layer or multiple layers including the above-described inorganic insulating materials.

The inorganic insulating layer IIL may include a first hole H1 that corresponds to the first transmission portion TA1. The first hole H1 may expose a portion of the upper surface of the buffer layer 111 or the substrate 100. The first hole H1 may overlap an opening of the first gate insulating layer 112, an opening of the second gate insulating layer 113, and an opening of the interlayer insulating layer 115 that are formed to correspond to the first transmission portion TA1. These openings may be individually formed through separate processes, or may be simultaneously formed through the same process. In a case where these openings are formed through separate processes, the inner surface of the first hole H1 may not be smooth and may have steps such as a staircase shape.

Alternatively, the inorganic insulating layer IIL may have a groove other than the first hole H1 that exposes the buffer layer 111. Alternatively, the inorganic insulating layer IIL may have neither the first hole H1 nor the groove that corresponds to the first transmission portion TA1.

The first and second source electrodes S1 and S2 and the first and second drain electrodes D1 and D2 may be arranged on the interlayer insulating layer 115. The first and second source electrodes S1 and S2 and the first and second drain electrodes D1 and D2 may be connected to the source regions S or the drain regions S of the first and second semiconductor layers A1 and A2, respectively. In this case, the first and second source electrodes S1 and S2 and the first and second drain electrodes D1 and D2 may be connected to the source regions S or the drain regions S of the first and second semiconductor layers A1 and A2 through contact holes provided in the inorganic insulating layer IIL, respectively.

Each of the first and second source electrodes S1 and S2 and the first and second drain electrodes D1 and D2 may include a conductive material such as molybdenum (Mo), aluminum (Al), copper (Cu), or titanium (Ti) and may include a single layer or multiple layers including the above-described materials. For example, each of the first and second source electrodes S1 and S2 and the first and second drain electrodes D1 and D2 may have a multiple layer structure of Ti/Al/Ti.

The organic insulating layer 117 may cover the first and second source electrodes S1 and S2 and the first and second drain electrodes D1 and D2. The organic insulating layer 117 may have a flat upper surface, and a first pixel electrode 121 and a second pixel electrode 121' that are arranged above the organic insulating layer 117 may be formed to have a flat upper surface as well.

The organic insulating layer 117 may include an organic material or an inorganic material and may have a single layer structure or a multiple layer structure. The organic insulating layer 117 may include a general-purpose polymer (e.g., benzocyclobutene (BCB), polyimide (PI), hexamethyldisiloxane (HMDSO), polymethylmethacrylate (PMMA), or polystyrene (PS)), a polymer derivative having a phenol-based group, an acrylic polymer, an imide-based polymer, an aryl ether-based polymer, an amide-based polymer, a fluorine-based polymer, a p-xylene-based polymer, or a vinyl alcohol-based polymer.

The organic insulating layer 117 may have a second hole H2 that corresponds to the first transmission portion TA1. The second hole H2 may overlap the first hole H1 of the inorganic insulating layer K. FIG. 8 illustrates that the second hole H2 is greater than the first hole H1. According to another embodiment, the organic insulating layer 117 may cover an edge of the first hole H1 of the inorganic insulating layer IIL, and the area of the second hole H2 may be less than the corresponding area of the first hole H1.

The organic insulating layer 117 may have a via hole that exposes one of the first source electrode S1 and the first drain electrode D1 of the main thin-film transistor TFTm. The first pixel electrode 121 may be arranged to be in contact with the first source electrode S1 or the first drain electrode D1 through the via hole, and the first pixel electrode 121 may be electrically connected to the main thin-film transistor TFTm. Also, the organic insulating layer 117 may have another via hole that exposes one of the second source electrode S2 and the second drain electrode D2 of the auxiliary thin-film transistor TFTa. The second pixel electrode 121' may be arranged to be in contact with the second source electrode S2 or the second drain electrode D2 through the via hole, and the second pixel electrode 121' may be electrically connected to the auxiliary thin-film transistor TFTa.

The first and second pixel electrodes 121 and 121' may include a conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). The first and second pixel electrodes 121 and 121' may include a reflective layer that includes silver (Ag), magnesium (Mg), aluminum (Al), platinum (Pt), palladium (Pd), gold (Au), nickel (Ni), neodymium (Nd), iridium (Ir), chromium (Cr), or any compound thereof. For example, each of the first and second pixel electrodes 121 and 121' may have a structure including one or more layers of ITO, IZO, ZnO, or $In_2O_3$ above/below the above-described reflective layer. For example, each of the first and second pixel electrodes 121 and 121' may have a stack structure of ITO/Ag/ITO.

A pixel defining layer 119 may cover edges of the first pixel electrode 121 and the second pixel electrode 121' that are arranged on the organic insulating layer 117 and may include a first opening OP1 and a second opening OP2 that respectively expose central portions of the first pixel electrode 121 and the second pixel electrode 121'. The first opening OP1 and the second opening OP2 define the sizes and shapes of emission areas of the organic light-emitting diodes OLEDm and OLEDa or emission areas of the sub-pixels Pm and Pa, respectively.

The pixel defining layer 119 may prevent an electric arc or the like from occurring on the edges of the first and second pixel electrodes 121 and 121' by increasing distances between the edges of the first and second pixel electrodes 121 and 121' and portions of an opposite electrode 123 on the first and second pixel electrodes 121 and 121'. The pixel defining layer 119 may include an organic insulating material such as PI, polyamide, acrylic resin, BCB, HMDSO, and phenolic resin, and may be formed by spin coating.

The pixel defining layer 119 may have a third hole H3 that corresponds to the first transmission portion TA1. The third hole H3 may overlap the first hole H1 of the inorganic insulating layer IIL and the second hole H2 of the organic insulating layer 117. The light transmittance in the first transmission portion TA1 may be improved by the first, second, and third holes H1, H2, and H3. Although FIG. 8 illustrates that the buffer layer 111 is continuously arranged to correspond to the first transmission portion TA1, the buffer layer 111 may have a hole corresponding to the first transmission portion TA1 in other embodiments.

In the first opening OP1 and the second opening OP2 of the pixel defining layer 119, a first emission layer 122b and a second emission layer 122b' may be arranged to correspond to the first pixel electrode 121 and the second pixel electrode 121', respectively. The first emission layer 122b and the second emission layer 122b' may include a high molecular-weight material or a low molecular-weight material, and may emit red, green, blue, or white light.

An organic functional layer 122e may be arranged above and/or below the first emission layer 122b and the second emission layer 122b'. The organic functional layer 122e may include a first functional layer 122a and/or a second functional layer 122c. The first functional layer 122a or the second functional layer 122c may be omitted in some embodiments.

The first functional layer 122a may be arranged below the first emission layer 122b and the second emission layer 122b'. The first functional layer 122a may include a single layer or multiple layers including an organic material. The first functional layer 122a may include a hole transport layer (HTL) that is a single layer. Alternatively, the first functional layer 122a may include a hole injection layer (HIL) and an HTL. The first functional layer 122a may be integrally formed to correspond to the main organic light-emitting diodes OLEDm included in the main display area MDA and the auxiliary organic light-emitting diode OLEDa included in the component area CA.

The second functional layer 122c may be arranged above the first emission layer 122b and the second emission layer 122b'. The second functional layer 122c may be a single layer or multiple layers including an organic material. The second functional layer 122c may include an electron transport layer (ETL) and/or an electron injection layer (EIL). The second functional layer 122c may be integrally formed to correspond to the main organic light-emitting diodes OLEDm included in the main display area MDA and the auxiliary organic light-emitting diode OLEDa included in the component area CA.

The opposite electrode 123 may be arranged above the second functional layer 122c. The opposite electrode 123 may include a conductive material having a low work function. For example, the opposite electrode 123 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. Alternatively, the opposite electrode 123 may include a layer, such as ITO, IZO, ZnO, or $In_2O_3$, on the (semi)transparent layer including the above-described material. The opposite electrode 123 may be integrally formed to correspond to the main organic light-emitting diodes OLEDm included in the main display area MDA and the auxiliary organic light-emitting diode OLEDa included in the component area CA.

The layers from the first pixel electrode 121 to the opposite electrode 123 in the main display area MDA may constitute the main organic light-emitting diode OLEDm. The layers from the second pixel electrode 121' to the opposite electrode 123 in the component area CA may constitute the auxiliary organic light-emitting diode OLEDa.

The organic functional layer 122e and the opposite electrode 123 may include a functional layer hole 122eH and an opposite electrode hole 123H that correspond to the first transmission portion TA1, respectively. According to an embodiment, the size of the functional layer hole 122eH may be less than the size of the opposite electrode hole 123H. According to another embodiment, the size of the functional layer hole 122eH may be substantially equal to the size of the opposite electrode hole 123H.

Due to the opposite electrode hole 123H, the opposite electrode 123 may not be arranged in the first transmission portion TA1. Thus, the light transmittance in the first transmission portion TA1 may be remarkably increased. The opposite electrode 123 having the opposite electrode hole 123H may be formed by various methods. According to an embodiment, after a material for the opposite electrode 123 is formed on the substrate 100, a portion corresponding to the first transmission portion TA1 may be removed by laser lift-off to form the opposite electrode hole 123H of the opposite electrode 123. According to another embodiment, the opposite electrode 123 having the opposite electrode hole 123H may be formed by metal self patterning (MSP). According to another embodiment, the opposite electrode 123 having the opposite electrode hole 123H may be formed through a process of depositing the opposite electrode 123 using a fine metal mask (FMM). Also, the organic functional layer 122e having the functional layer hole 122eH may also be formed using laser lift-off, MSP, or FMM.

In the first transmission portion TA1, a first transmission hole ILH1 of the insulating layer IL may include the first hole H1 of the inorganic insulating layer IIL and the second hole H2 of the organic insulating layer 117 that overlap the first hole H1. The first transmission hole ILH1 may expose the upper surface of the substrate 100 or the upper surface of the buffer layer 111, and may be connected to the third hole H3 of the pixel defining layer 119. Also, the third hole H3 may be connected to the functional layer hole 122eH of the organic functional layer 122e and the opposite electrode hole 123H of the opposite electrode 123.

In the present embodiment, the second transmission portion TA2 may be arranged in the second component area CA2. Similar to the first transmission portion TA1, the insulating layer IL may include a second transmission hole ILH2 in the second transmission portion TA2. The second transmission hole ILH2 may overlap the second transmission portion TA2, and may expose the upper surface of the substrate 100 or the upper surface of the buffer layer 111. Specifically, similar to the first transmission portion TA1, the inorganic insulating layer IIL may have a first hole H1 of the inorganic insulating layer IIL in the second transmission portion TA2, and the organic insulating layer 117 may have a second hole H2 of the organic insulating layer 117 that corresponds to the second transmission portion TA2. That is, in the second transmission portion TA2, the second transmission hole ILH2 of the insulating layer IL may include the first hole H1 of the inorganic insulating layer IIL and the second hole H2 of the organic insulating layer 117 that overlaps the first hole H1.

The pixel defining layer 119 may have a third hole H3 arranged in the second transmission portion TA2, and the third hole H3 may be connected to the second transmission hole ILH2. That is, the second transmission hole ILH2 and the third hole H3 may be connected to each other.

The organic functional layer 122e and the opposite electrode 123 may include a functional layer hole 122eH and an opposite electrode hole 123H in the second transmission portion TA2, respectively. The functional layer hole 122eH and the opposite electrode hole 123H may be connected to the second transmission hole ILH2 and the third hole H3 of the second transmission portion TA2.

In the present embodiment, an alignment pattern AP may be arranged on the substrate 100 overlapping the second transmission hole ILH2. The alignment pattern AP may be arranged on at least one of the second transmission portions TA2 arranged in the second component area CA2, and may overlap the second transmission hole ILH2. The second component area CA2 may have a plurality of second transmission portions TA2 and a plurality of second transmission holes ILH2. In this case, the second transmission holes ILH2 may be arranged in the second transmission portions TA2, respectively. At least one of the second transmission holes ILH2 may overlap the alignment pattern AP, and the alignment pattern AP may not be arranged in other ones of the second transmission holes ILH2.

The alignment pattern AP may be exposed by the second transmission hole ILH2. Specifically, the first hole H1 of the inorganic insulating layer IIL, the second hole H2 of the organic insulating layer 117, the third hole H3 of the pixel defining layer 119, the functional layer hole 122eH of the organic functional layer 122e, and the opposite electrode hole 123H of the opposite electrode 123 may expose the alignment pattern AP in the second transmission portion TA2.

Referring to FIG. 8, the alignment pattern AP may include the same material as that of at least one of the source region S and the drain region D of the first and second semiconductor layers A1 and A2. For example, the alignment pattern AP may include polysilicon. As another example, the alignment pattern AP may include amorphous silicon. As yet another example, the alignment pattern AP may include oxide of at least one material selected from indium (In), gallium (Ga), stannum (Sn), zirconium (Zr), vanadium (V), hafnium (Hf), cadmium (Cd), germanium (Ge), chromium (Cr), titanium (Ti), and zinc (Zn). The alignment pattern AP may be doped similarly to the source region S or the drain region D. In this case, the light transmittance of the second transmission portion TA2 may be lower than the light transmittance of the first transmission portion TA1.

The alignment pattern AP may be formed simultaneously with the first and second semiconductor layers A1 and A2. In this case, the alignment pattern AP may be formed in the second component area CA2 without an additional process.

Figure 9:
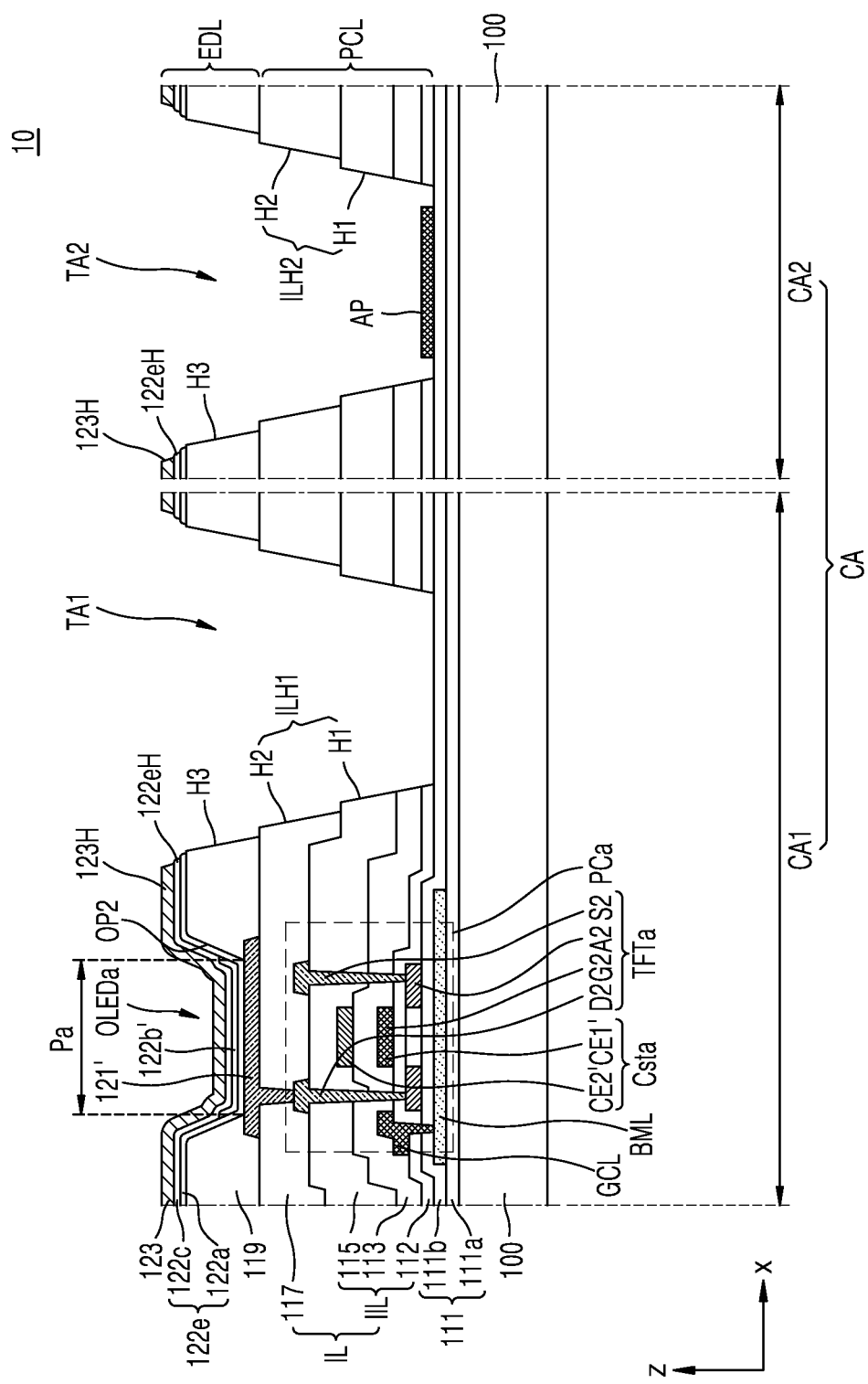

Referring to FIG. 9, the alignment pattern AP may include the same material as that of the second gate electrode G2. According to an embodiment, the second gate electrode G2 is integrally provided with the second lower electrode CE1', and the alignment pattern AP may include the same material as that of the second lower electrode CE1'. For example, the alignment pattern AP may include molybdenum (Mo), aluminum (Al), copper (Cu), titanium (Ti), or the like and may include a single layer or multiple layers. For example, the alignment pattern AP may include a single Mo layer.

The alignment pattern AP may be formed simultaneously with the second gate electrode G2. In this case, the alignment pattern AP may be formed in the second component area CA2 without an additional process.

Figure 10:
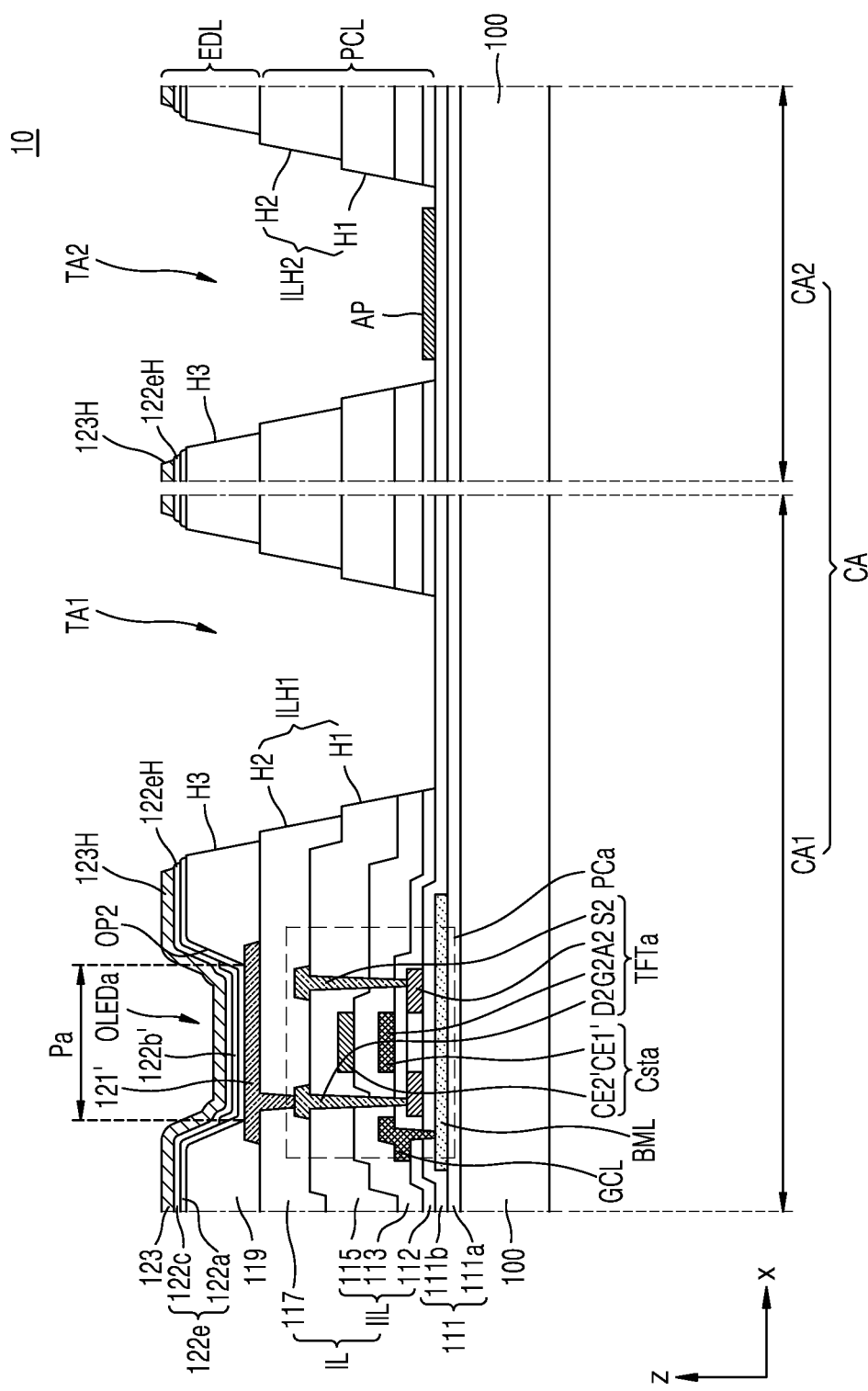

Referring to FIG. 10, the alignment pattern AP may include the same material as that of the second upper electrode CE2'. For example, the alignment pattern AP may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may include a single layer or multiple layers including the above-described materials.

The alignment pattern AP may be formed simultaneously with the second upper electrode CE2'. In this case, the alignment pattern AP may be formed in the second component area CA2 without an additional process.

Figure 11:
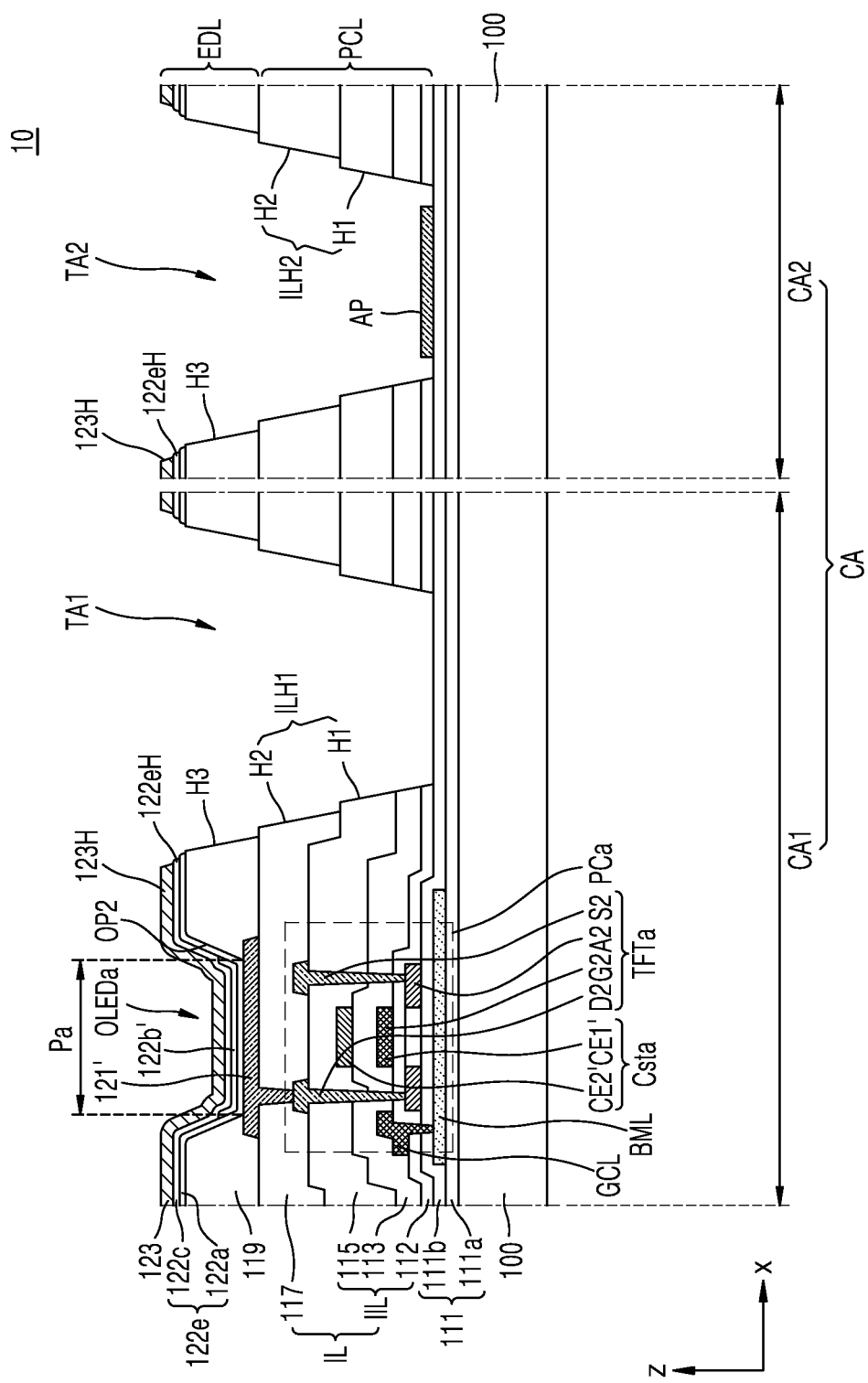

Referring to FIG. 11, the alignment pattern AP may include the same material as that of one of the second source electrode S2 and the second drain electrode D2. The alignment pattern AP may include a conductive material including molybdenum (Mo), aluminum (Al), copper (Cu), and titanium (Ti), and may include a single layer or multiple layers including the above-described materials. For example, the alignment pattern AP may have a multiple layer structure of Ti/Al/Ti.

The alignment pattern AP may be formed simultaneously with at least one of the second source electrode S2 and the second drain electrode D2. In this case, the alignment pattern AP may be formed in the second component area CA2 without an additional process.

Figure 12:
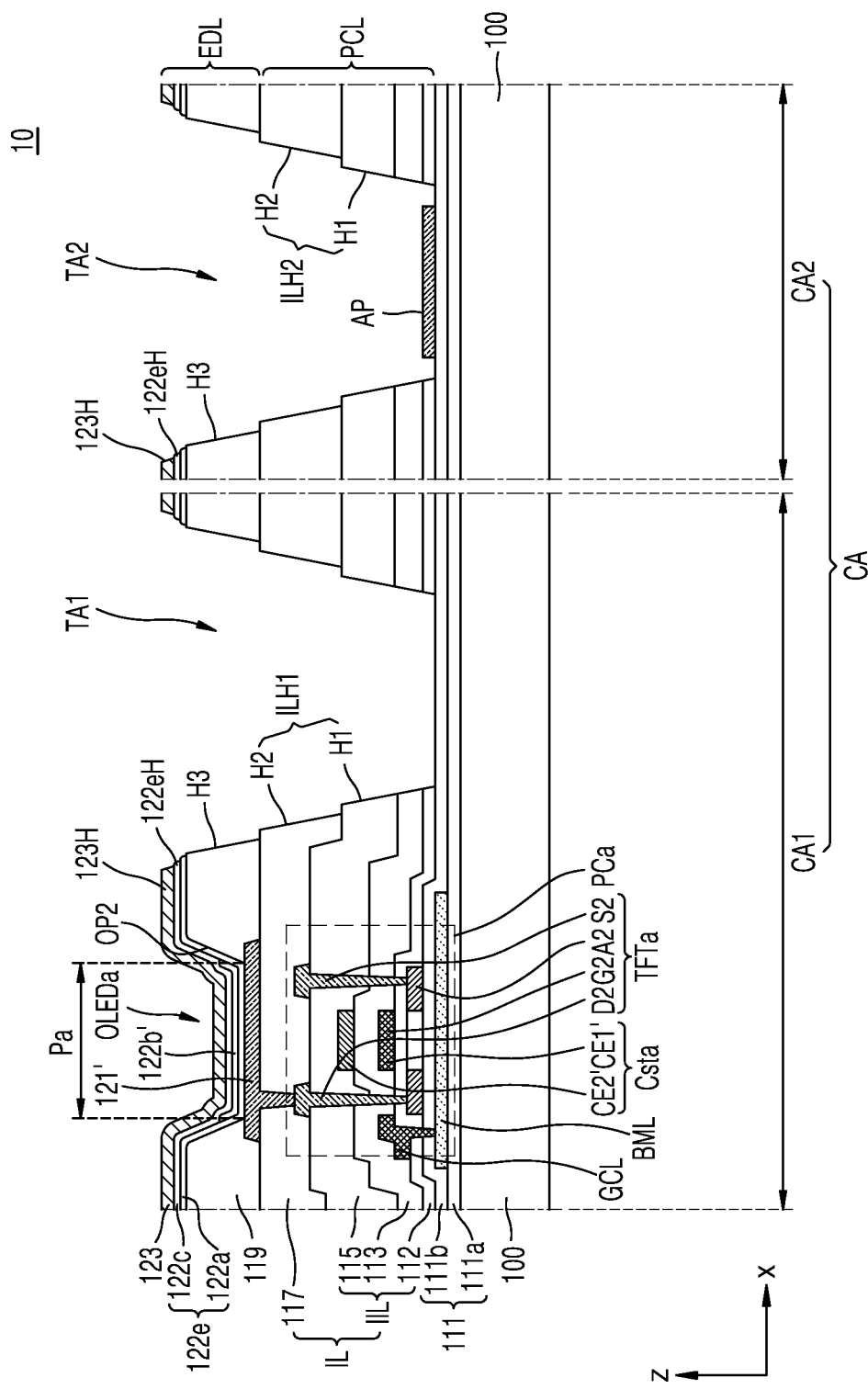

Referring to FIG. 12, the alignment pattern AP may include the same material as that of the second pixel electrode 121'. The alignment pattern AP may include conductive oxide such as ITO, IZO, ZnO, $In_2O_3$, IGO, or AZO. The alignment pattern AP may include a reflective layer including silver (Ag), magnesium (Mg), aluminum (Al), platinum (Pt), palladium (Pd), gold (Au), nickel (Ni), neodymium (Nd), iridium (Ir), chromium (Cr), or any compound thereof. For example, the alignment pattern AP may have a structure including one or more layers of ITO, IZO, ZnO, or $In_2O_3$ above and/or under the reflective layer. For example, the alignment pattern AP may have a stack structure of ITO/Ag/ITO. In a case where the alignment pattern AP includes a reflective layer, the light transmittance of the second transmission portion TA2 may be lower than the light transmittance of the first transmission portion TA1.

The alignment pattern AP may be formed simultaneously with the second pixel electrode 121'. In this case, the alignment pattern AP may be formed in the second component area CA2 without an additional process.

FIGS. 13 to 16 are schematic cross-sectional views of a portion of the display panel 10, according to various embodiments. In FIGS. 13 to 16, the same reference numerals as those in FIG. 8 refer to the same members, and redundant descriptions thereof will be omitted.

Referring to FIGS. 13 to 16, the display panel 10 may include: the substrate 100 including the first component area CA1, the second component area CA2, and the main display area MDA; the insulating layer IL arranged on the substrate 100; and an organic light-emitting diode (e.g., the auxiliary organic light-emitting diode OLEDa) as a display element arranged on the insulating layer IL.

The first transmission portion TA1 may be arranged in the first component area CA1. In the first transmission portion TA1, the insulating layer IL may have the first transmission hole ILH1 that exposes the upper surface of the substrate 100 or the buffer layer 111. The first transmission hole ILH1 may include the first hole H1 of the inorganic insulating layer IIL in the first transmission portion TA1 and the second hole H2 of the organic insulating layer 117 in the first transmission portion TA1. In this case, the first hole H1 and the second hole H2 may be connected to each other.

The auxiliary organic light-emitting diode OLEDa that corresponds to the auxiliary subpixel Pa may be arranged in the first component area CA1. The auxiliary organic light-emitting diode OLEDa may include the second pixel electrode 121', the second emission layer 122b', and the opposite electrode 123. The pixel defining layer 119 may cover the edges of the second pixel electrode 121', and the size and shape of the auxiliary subpixel Pa may correspond to the second opening OP2 of the pixel defining layer 119 that exposes the central portion of the second pixel electrode 121'. The pixel defining layer 119 may have the third hole H3 in the first transmission portion TA1, and the third hole H3 may be connected to the first transmission hole ILH1.

According to an embodiment, the organic functional layer 122e and the opposite electrode 123 may extend to the first transmission portion TA1, and the organic functional layer 122e and the opposite electrode 123 may include the functional layer hole 122eH and the opposite electrode hole 123H that are connected to the first transmission hole ILH1, respectively. In this case, the organic functional layer 122e and the opposite electrode 123 may extend to the inner surface of the first transmission hole ILH1. In this case, the size of the functional layer hole 122eH and the size of the opposite electrode hole 123H may be less than the size of the first transmission hole ILH1. The size of the first transmission hole ILH1 may correspond to a distance between the side surfaces of the first gate insulating layer 112 that face each other in the first transmission portion TA1. The sizes of the functional layer hole 122eH and the opposite electrode hole 123H may correspond to a distance between the side surfaces of the organic functional layer 122e and the side surface of the opposite electrode 123 that face each other in the first transmission portion TA1. According to another embodiment, the size of the functional layer hole 122eH and the size of the opposite electrode hole 123H may be greater than the size of the first transmission hole ILH1.

According to an embodiment, the size of the functional layer hole 122eH may be substantially the same as the size of the opposite electrode hole 123H. According to another embodiment, the size of the functional layer hole 122eH may be different from the size of the opposite electrode hole 123H.

In the present embodiment, at least one of the inorganic insulating layer IIL and the organic insulating layer 117 may have the second transmission hole ILH2 that exposes the upper surface of the substrate 100 or the buffer layer 111 in the second transmission portion TA2.

Figure 13:
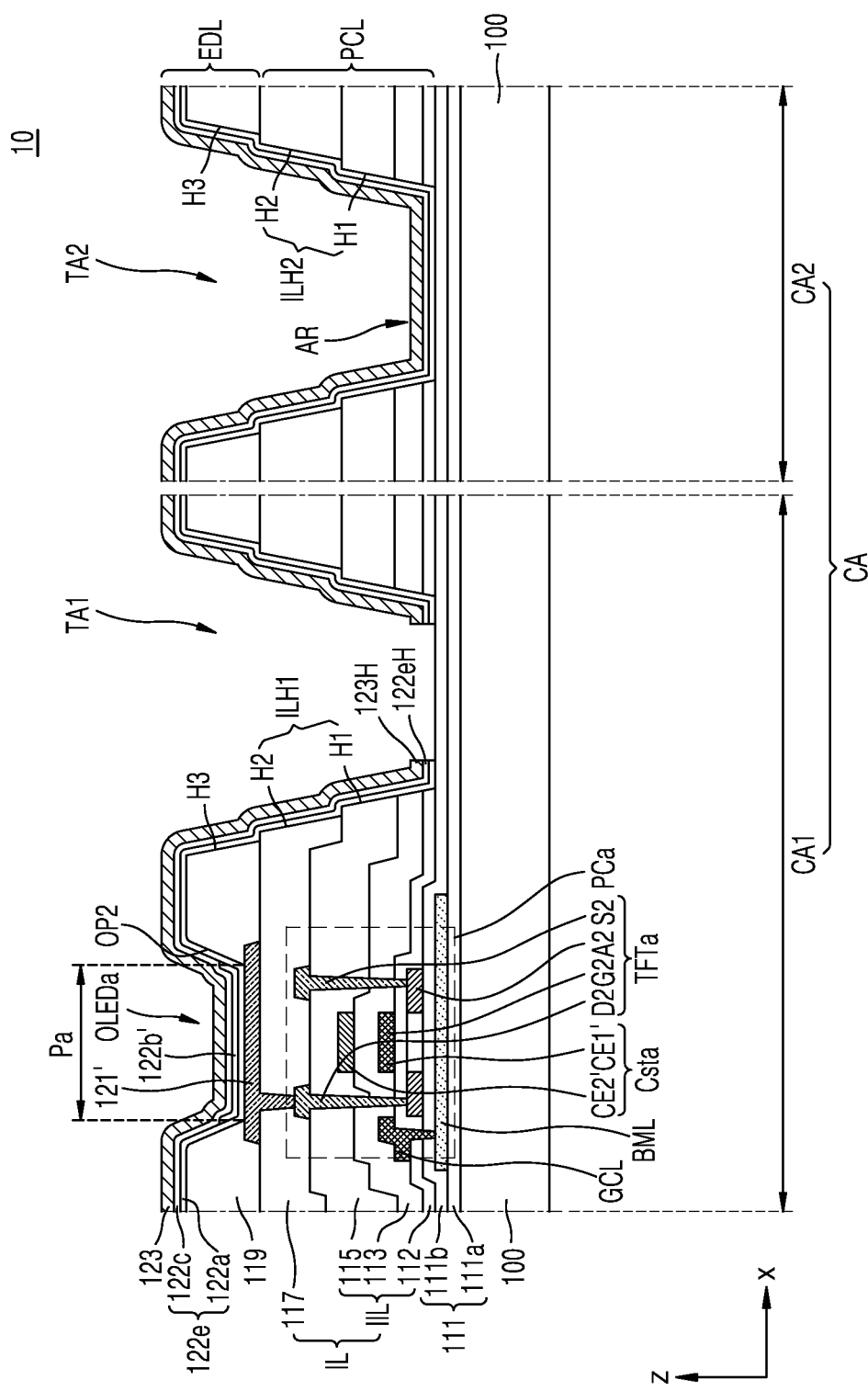
FIGS. 13, 14, 15, and 16 are schematic cross-sectional views of a portion of a display panel, according to various embodiments.

Referring to FIG. 13, similar to the first transmission portion TA1, the inorganic insulating layer IIL may have a first hole H1 in the second transmission portion TA2. Also, similar to the first transmission portion TA1, the organic insulating layer 117 may have a second hole H2 in the second transmission portion TA2. In this case, the second transmission hole ILH2 may include the first hole H1 and the second hole H2 in the second transmission portion TA2.

Also, similar to the first transmission portion TA1, the pixel defining layer 119 may have a third hole H3 in the second transmission portion TA2. In this case, the third hole H3 in the second transmission portion TA2 may be connected to the second transmission hole ILH2.

In the present embodiment, the organic functional layer 122e and the opposite electrode 123 may be continuously arranged in the second transparent portion TA2. Specifically, a plurality of second transmission portions TA2 may be arranged in the second component area CA2. In this case, the organic functional layer 122e and the opposite electrode 123 may be continuously arranged in at least one of the second transmission portions TA2. Therefore, at least one of the second transmission portions TA2 may have a light transmittance that is different from that of the first transmission portion TA1. In this case, at least one of the second transmission portions TA2 may serve as an alignment reference AR. The second transmission portions TA2 having a light transmittance that is different from that of the first transmission portion TA1 may be formed without an additional process.

Figure 14:
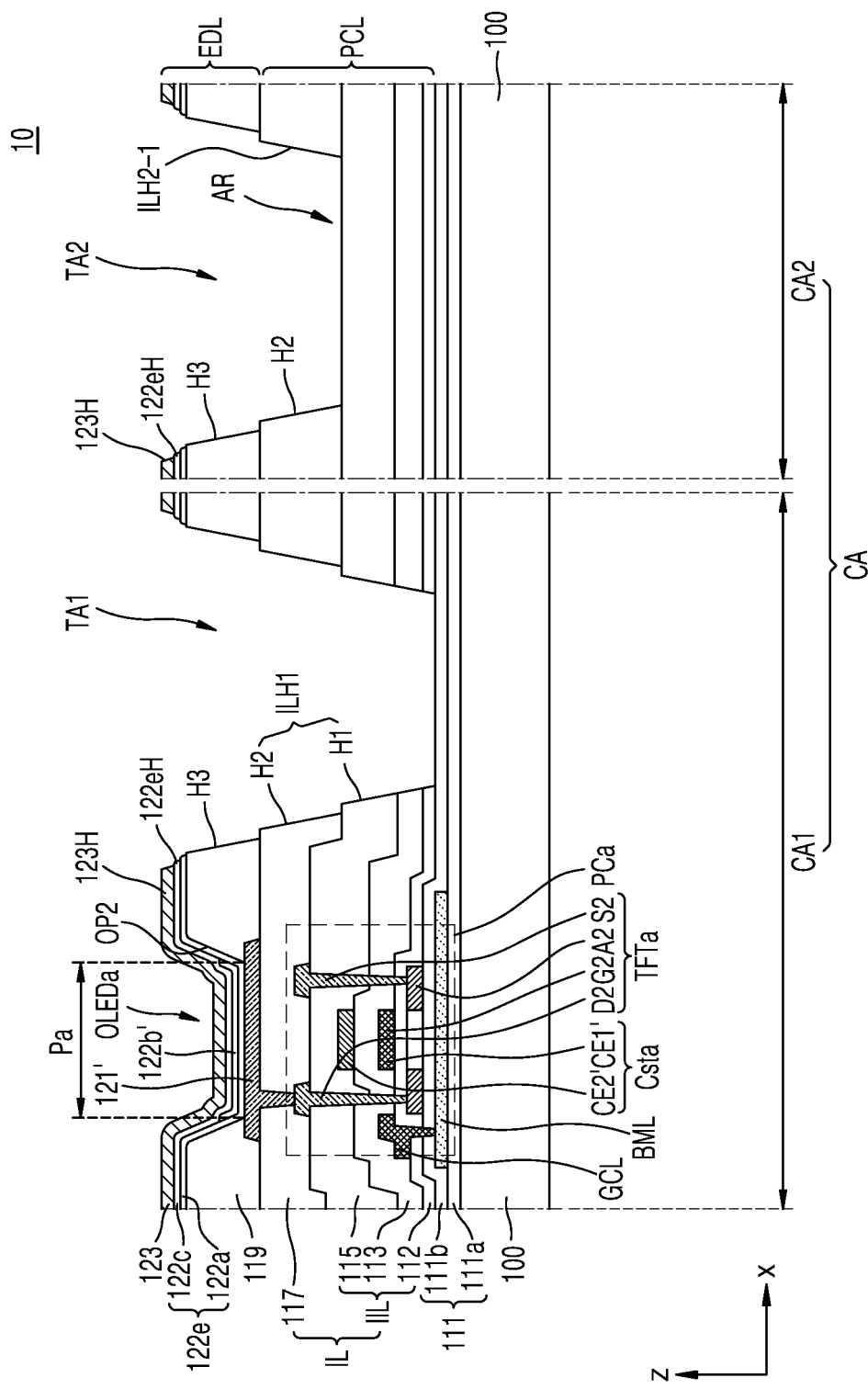

Referring to FIG. 14, the inorganic insulating layer IIL may be continuously arranged in the second transmission portion TA2. In this case, the inorganic insulating layer IIL may not have the first hole H1 in the second transmission portion TA2. The organic insulating layer 117 may have a second hole H2 in the first transmission portion TA1 and the second transmission portion TA2, respectively. In this case, the second hole H2 in the second transmission portion TA2 may be referred to as a second transmission hole ILH2-1, and the second transmission hole ILH2-1 may be connected to the third hole H3.

In the present embodiment, a plurality of second transmission portions TA2 may be arranged in the second component area CA2. The inorganic insulating layer IIL may be continuously arranged in at least one of the second transmission portions TA2. At least one of the second transmission portions TA2 may have a light transmittance that is different from that of the first transmission portion TA1. In this case, at least one of the second transmission portions TA2 may serve as an alignment reference AR. The second transmission portions TA2 having a light transmittance that is different from that of the first transmission portion TA1 may be formed without an additional process.

Figure 15:
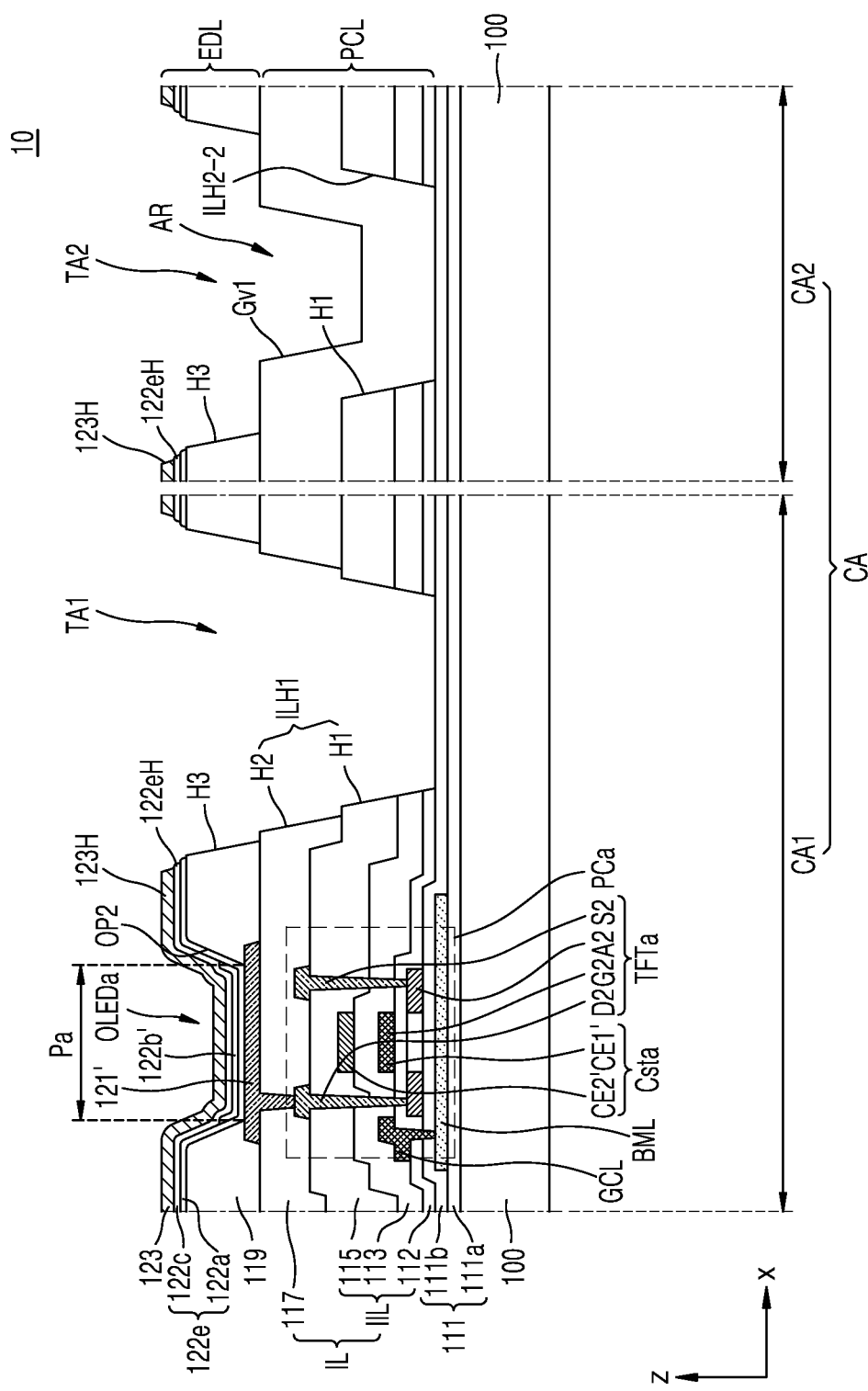

Referring to FIG. 15, the inorganic insulating layer IIL may have a first hole H1 in the first transmission portion TA1 and the second transmission portion TA2, respectively. The second hole H2 in the second transmission portion TA2 may be referred to as a second transmission hole ILH2-2. The organic insulating layer 117 may be continuously arranged in the second transmission portion TA2. The organic insulating layer 117 may cover the first hole H1 of the second transmission portion TA2 to form a first groove Gv1 having a concave shape. The first groove Gv1 may be connected to the third hole H3 of the pixel defining layer 119 in the second transmission portion TA2.

In the present embodiment, a plurality of second transmission portions TA2 may be arranged in the second component area CA2. The organic insulating layer 117 may be continuously arranged in at least one of the second transmission portions TA2. The second transmission portions TA2 may have a light transmittance that is different from that of the first transmission portion TA1. The second transmission portions TA2 may serve as an alignment reference AR. The second transmission portions TA2 having a light transmittance that is different from that of the first transmission portion TA1 may be formed without an additional process.

Figure 16:
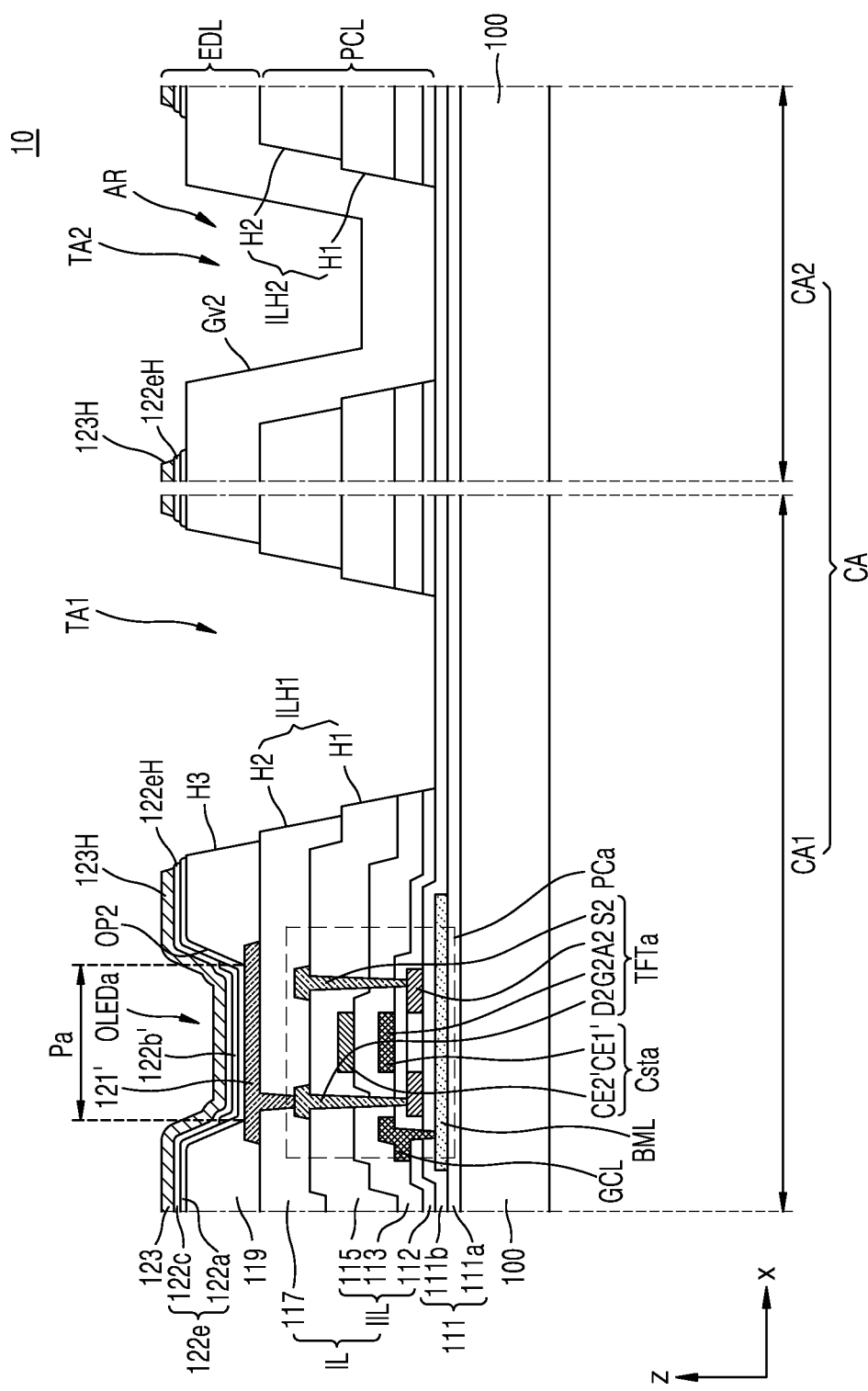

Referring to FIG. 16, the inorganic insulating layer IIL may have a first hole H1 in the first transmission portion TA1 and the second transmission portion TA2, respectively. Also, the organic insulating layer 117 may have a second hole H2 in the first transmission portion TA1 and the second transmission portion TA2, respectively. In this case, the first hole H1 and the second hole H2 in the second transmission portion TA2 may be referred to as a second transmission hole ILH2.

In the present embodiment, the pixel defining layer 119 may be continuously arranged in the second transmission portion TA2. Specifically, the pixel defining layer 119 may have a third hole H3 that is connected to the first transmission hole ILH1 in the first transmission portion TA1, and may be continuously arranged in the second transmission portion TA2. The pixel defining layer 119 may cover the second transmission hole ILH2 to form a second groove Gv2 having a concave shape.

In the present embodiment, a plurality of second transmission portions TA2 may be arranged in the second component area CA2. The pixel defining layer 119 may be continuously arranged in at least one of the second transmission portions TA2. Therefore, the second transmission portions TA2 may have a light transmittance that is different from that of the first transmission portion TA1. The second transmission portions TA2 may serve as an alignment reference AR. Some of the second transmission portions TA2 having a light transmittance that is different from that of the first transmission portion TA1 may be formed without an additional process.

Figure 17:
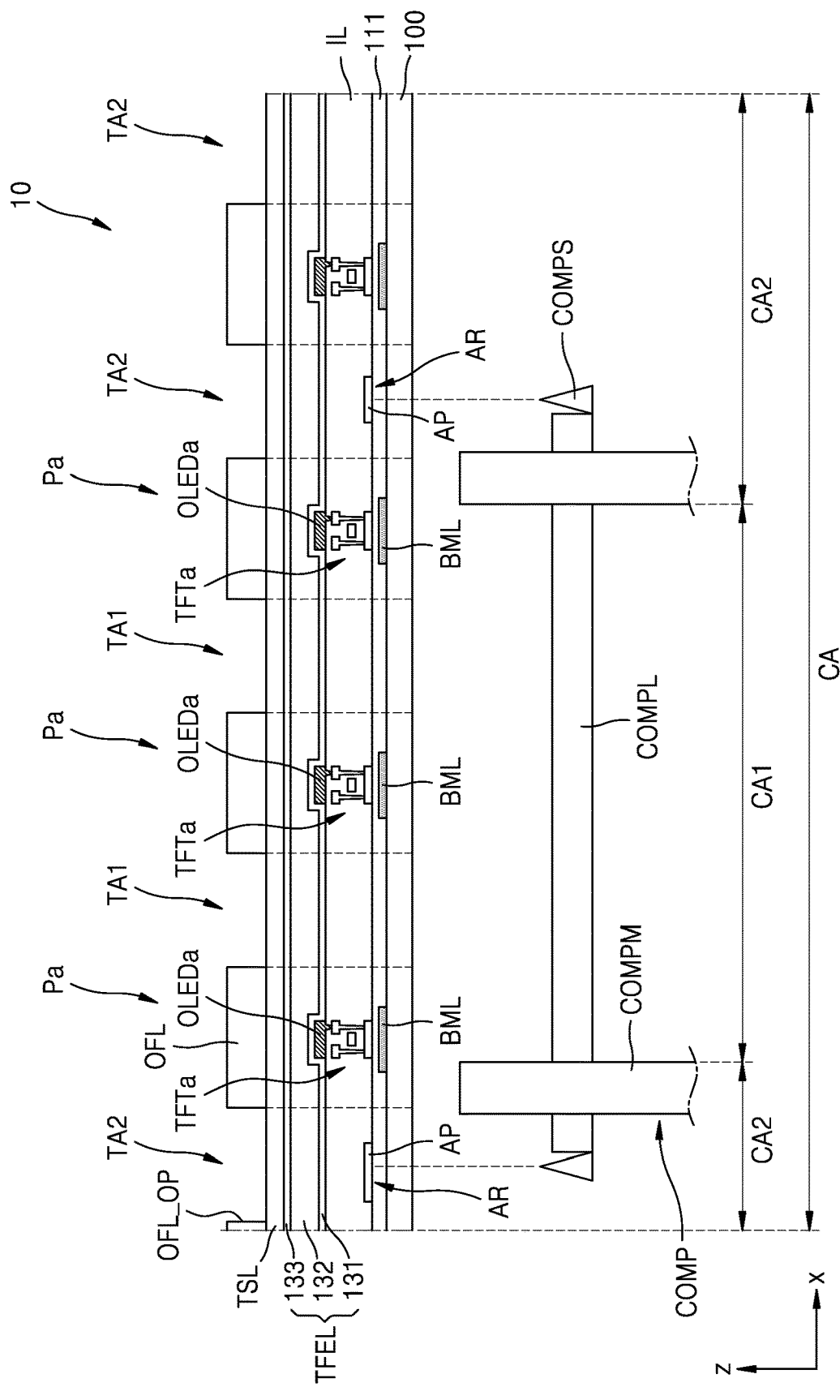
FIG. 17 is a schematic cross-sectional view of a display panel and a component, according to another embodiment.

FIG. 17 is a schematic cross-sectional view of the display panel 10 and the component COMP, according to another embodiment.

Referring to FIG. 17, the display panel 10 may include the component area CA that overlaps the component COMP. The auxiliary subpixel Pa implemented as the auxiliary organic light-emitting diode OLEDa may be arranged in the component area CA. The component area CA may include a first component area CA1 and a second component area CA2.

In the present embodiment, a first transmission portion TA1 may be arranged in the first component area CA1, and a second transmission portion TA2 may be arranged in the second component area CA2.

According to an embodiment, a plurality of second transmission portions TA2 may be provided in the second component area CA2. In this case, the alignment pattern AP described above with reference to FIGS. 8 to 12 may be arranged in some of the second transmission portions TA2. Alternatively, some of the second transmission portions TA2 described above with reference to FIGS. 13 to 16 may serve as an alignment reference AR.

The component COMP may be arranged below the display panel 10. According to an embodiment, the component COMP may include the lens COMPL, the module COMPM, and a sensor COMPS.

External light may be incident onto the component COMP through the lens COMPL, and light emitted from the component COMP may be transmitted through the lens COMPL. The lens COMPL may overlap the first component area CA1. In this case, the component area CA overlapping the lens COMPL may correspond to a first component area CA1.

The module COMPM may correspond to the remaining portion of the component COMP connected to the lens COMPL. For example, the module COMPM may include a frame. The module COMPM may overlap the second component area CA2.

In the present embodiment, the sensor COMPS may be connected to the module COMPM. The sensor COMPS may detect a position of the alignment pattern AP. For example, the sensor COMPS may include an infrared light-emitting portion and/or an infrared light-receiving portion. The infrared light-emitting portion of the sensor COMP may emit infrared light to the alignment pattern AP, and the infrared light-receiving portion of the sensor COMPS may receive the infrared light reflected from the alignment pattern AP. Therefore, the sensor COMPS may detect the position of the alignment pattern AP.

According to another embodiment, the sensor COMPS may detect the position of the alignment reference AR. For example, the sensor COMPS may detect the position of the second transmission portion TA2 that is set as the alignment reference AR based on the difference between the light transmittance of the first transmission portion TA1 and the light transmittance of the second transmission portion TA2. Alternatively, the sensor COMPS may detect the position of the alignment reference AR based on the difference between the light transmittance of the second transmission portion TA2 that is not set as the alignment reference AR and the light transmittance of the second transmission portion TA2 that is set as the alignment reference AR. Because the light transmittance or light reflectance in the second transmission portion TA2 that is set as the alignment reference AR is different from the light transmittance or light reflectance in the first transmission portion TA1, the position of the second transmission portion TA2 that is set as the alignment reference AR may be detected.

Therefore, in a case where the component area CA and the component COMP of the display panel 10 are not precisely aligned with each other, the component area CA and the component COMP may be aligned with each other using the position of the alignment reference AR or the alignment pattern AP that is detected by the sensor COMPS. In a case where the component COMP is a camera having a camera shaking correction function, the position of the camera may be corrected using the position of the alignment pattern AP or the alignment reference AR.

As described above, the alignment pattern AP arranged on the substrate 100 and overlapping the second transmission hole ILH2 may be provided to accurately align the component COMP with the component area CA.

Also, the stack structure of the elements constituting at least one of the second transmission portions TA2 may be different from the stack structure of the elements constituting the first transmission portion TA1, and the light transmittance of at least one of the second transmission portions TA2 may be different from the light transmittance of the first transmission portion TA1. Therefore, at least one of the second transmission portions TA2 may serve as the alignment reference AR, and the component COMP may be accurately aligned with the component area CA.

It should be understood that the embodiments described herein should be considered in a descriptive sense only and not for purposes of limitation. Descriptions of features or aspects within each embodiment should be considered as available in other embodiments. While one or more embodiments have been described with reference to the figures, it will be understood by those of ordinary skill in the art that various changes in form and details may be made therein without departing from the spirit and scope of the present disclosure including the following claims.

What is claimed is:
1. A display device comprising:
a substrate including a first component area in which a first transmission portion is arranged, a second component area that surrounds the first component area and in which a second transmission portion is arranged, and a main display area surrounding at least a portion of the second component area;
the plurality of insulating layers having a first transmission hole corresponding to the first transmission portion and a second transmission hole corresponding to the second transmission portion, the first transmission hole and the second transmission hole exposing an upper surface of one of the plurality of insulating layers;

a plurality of display elements arranged on the plurality of insulating layers corresponding to the first component area, the second component area, and the main display area; and an alignment pattern arranged on the one of the plurality of insulating layers in the second transmission hole and configured to align a component with the second component area.

2. The display device of claim 1, wherein the plurality of insulating layers comprise an inorganic insulating layer arranged on the substrate and an organic insulating layer arranged on the inorganic insulating layer, and wherein the inorganic insulating layer has a first hole that exposes the alignment pattern in the second transmission portion.

3. The display device of claim 2, wherein the organic insulating layer has a second hole connected to the first hole, and wherein the second hole exposes the alignment pattern.

4. The display device of claim 1, wherein each of the plurality of display elements comprises a pixel electrode and an opposite electrode, wherein the opposite electrode has an opposite electrode hole connected to the second transmission hole, and wherein the opposite electrode hole exposes the alignment pattern.

5. The display device of claim 1, further comprising a thin-film transistor connected to each of the plurality of display elements, the thin-film transistor comprising a semiconductor layer that includes a channel region, and a source region and a drain region that are arranged on sides of the channel region, wherein the alignment pattern includes a same material as that of at least one of the source region and the drain region.

6. The display device of claim 1, further comprising:

a thin-film transistor connected to each of the plurality of display elements, the thin-film transistor comprising a semiconductor layer that includes a channel region and a gate electrode overlapping the channel region; and a storage capacitor comprising a lower electrode that is integrally provided with the gate electrode and an upper electrode that is arranged on the lower electrode, wherein the alignment pattern includes a same material as that of one of the lower electrode and the upper electrode.

7. The display device of claim 1, further comprising a thin-film transistor arranged on the substrate, the thin-film transistor comprising: a semiconductor layer that includes a channel region, and a source region and a drain region that are arranged on sides of the channel region; and a source electrode and a drain electrode respectively connected to the source region and the drain region, wherein the plurality of insulating layers comprise an inorganic insulating layer that covers the semiconductor layer and an organic insulating layer that is arranged on the inorganic insulating layer, wherein the source electrode and the drain electrode are arranged between the inorganic insulating layer and the organic insulating layer, and wherein the alignment pattern includes a same material as that of one of the source electrode and the drain electrode.

8. The display device of claim 1, wherein each of the plurality of display elements comprises a pixel electrode and an opposite electrode, and wherein the alignment pattern includes a same material as that of the pixel electrode.

9. The display device of claim 1, wherein the component comprises:

a lens overlapping the first component area; and a module in which the lens is arranged, the module overlapping the second component area.

10. The display device of claim 9, wherein the module comprises an alignment mark that overlaps the alignment pattern.

11. The display device of claim 9, wherein the component further comprises a sensor that is connected to the module and configured to detect a position of the alignment pattern.

12. The display device of claim 1, wherein the second transmission portion comprises a plurality of second transmission portions in the second component area, wherein the plurality of insulating layers have a plurality of second transmission holes in the plurality of second transmission portions, respectively, and wherein the alignment pattern overlaps at least one of the plurality of second transmission holes.

13. A display device comprising:

a substrate including a first component area in which a first transmission portion is arranged, a second component area that surrounds the first component area and in which a second transmission portion is arranged, the second transmission portion having a second light transmittance that is different from a first light transmittance of the first transmission portion, and a main display area surrounding at least a portion of the second component area;

a plurality of insulating layers arranged on the substrate and having a first transmission hole corresponding to the first transmission portion and a second transmission hole corresponding to the second transmission portion, the first transmission hole and the second transmission hole exposing an upper surface of one of the plurality of insulating layers; and a plurality of display elements arranged on the plurality of insulating layers corresponding to the first component area, the second component area, and the main display area, wherein a component is disposed under the first component area and the second component area to overlap the first component area and the second component area in a plan view, wherein the plurality of insulating layers comprises an inorganic insulating layer and an organic insulating layer that is arranged on the inorganic insulating layer, and wherein the second component area includes at least one additional layer disposed on the upper surface of the one of the plurality of insulating layers.

14. The display device of claim 13, wherein the at least one additional layer includes an inorganic insulating layer which is removed in the first transmission hole.

15. The display device of claim 13, wherein the at least one additional layer includes an organic layer which is removed in the first transmission hole.

16. The display device of claim 13, wherein each of the plurality of display elements comprises a pixel electrode, a pixel defining layer that covers an edge of the pixel electrode, and an opposite electrode, wherein the at least one additional layer includes the pixel defining.

17. The display device of claim 13, wherein each of the plurality of display elements comprises a pixel electrode and an opposite electrode, and wherein the at least one additional layer includes the opposite electrode.

18. The display device of claim 13, wherein the component comprises:

a lens overlapping the first component area; and a module in which the lens is arranged, the module overlapping the second component area.

19. The display device of claim 18, further comprising an alignment mark that overlaps the second transmission portion.

20. The display device of claim 18, wherein the component further comprises a sensor connected to the module and configured to detect a position of the second transmissive portion using a difference between the first light transmittance of the first transmission portion and the second light transmittance of the second transmission portion.

* * * * *